United States Patent
Aiura et al.

(10) Patent No.: US 12,176,224 B2
(45) Date of Patent: Dec. 24, 2024

(54) SUBSTRATE PROCESSING APPARATUS AND SUBSTRATE PROCESSING METHOD

(71) Applicant: Tokyo Electron Limited, Tokyo (JP)

(72) Inventors: Kazuhiro Aiura, Koshi (JP); Yoshifumi Amano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/706,425

(22) PCT Filed: Sep. 30, 2022

(86) PCT No.: PCT/JP2022/036638
§ 371 (c)(1),
(2) Date: May 1, 2024

(87) PCT Pub. No.: WO2023/079872
PCT Pub. Date: May 11, 2023

(65) Prior Publication Data
US 2024/0332041 A1    Oct. 3, 2024

(30) Foreign Application Priority Data
Nov. 4, 2021  (JP) .................. 2021-179937

(51) Int. Cl.
*H01L 21/67*   (2006.01)
*H01L 21/306*  (2006.01)

(52) U.S. Cl.
CPC .... *H01L 21/6708* (2013.01); *H01L 21/30604* (2013.01)

(58) Field of Classification Search
None
See application file for complete search history.

(56) References Cited

U.S. PATENT DOCUMENTS

| | | | | |
|---|---|---|---|---|
| 5,625,433 | A * | 4/1997 | Inada | G03F 7/3021 396/604 |
| 7,575,634 | B2 * | 8/2009 | Shite | H01L 21/67017 118/62 |
| 11,306,249 | B2 * | 4/2022 | Hiroshiro | H01L 21/68764 |
| 11,545,367 | B2 * | 1/2023 | Sakazaki | H01L 21/6708 |
| 2006/0102069 | A1 * | 5/2006 | Tokuri | G03F 7/3021 118/52 |

(Continued)

FOREIGN PATENT DOCUMENTS

| | | |
|---|---|---|
| JP | 2006-147672 A | 6/2006 |
| JP | 2016-054170 A | 4/2016 |

*Primary Examiner* — Shamim Ahmed
(74) *Attorney, Agent, or Firm* — Armstrong Teasdale LLP

(57) ABSTRACT

A substrate processing apparatus includes: a substrate rotator configured to hold and rotate a substrate; an outer cup configured to annularly cover a periphery of the substrate held by the substrate rotator; an inner cup disposed inside the outer cup and under the substrate held by the substrate rotator; an annular drain formed between the outer cup and the inner cup to discharge a processing liquid supplied to the substrate outward; and an exhaust passage formed inside the inner cup, wherein the inner cup has an exhaust hole through which a liquid reception space, which is formed by the inner cup and the outer cup, and the exhaust passage are in communication with each other, and the exhaust hole is formed obliquely downward from an outer surface to an inner surface of the inner cup.

15 Claims, 18 Drawing Sheets

(56) References Cited

U.S. PATENT DOCUMENTS

| | | | |
|---|---|---|---|
| 2010/0227056 A1* | 9/2010 | Takayanagi | H01L 21/67051 118/52 |
| 2011/0135820 A1* | 6/2011 | Imamura | G03F 7/162 118/699 |
| 2014/0026927 A1* | 1/2014 | Ogata | H01L 21/67051 134/104.2 |
| 2014/0116480 A1* | 5/2014 | Higashijima | H01L 21/67051 134/153 |
| 2015/0155197 A1* | 6/2015 | Tachibana | G03F 7/162 438/782 |
| 2016/0064256 A1* | 3/2016 | Amano | H01L 21/6715 134/138 |

* cited by examiner

SUBSTRATE PROCESSING APPARATUS AND SUBSTRATE PROCESSING METHOD

CROSS-REFERENCE TO RELATED APPLICATIONS

The present application is a U.S. National Stage Entry of International Patent Application No. PCT/JP2022/036638, filed Sep. 30, 2022, which claims the benefit of priority to Japanese Patent Application No. 2021-179937, filed Nov. 4, 2021, each of which is hereby incorporated herein by reference in its entirety.

TECHNICAL FIELD

Embodiments disclosed herein relate to a substrate processing apparatus and a substrate processing method.

BACKGROUND

In the related art, there is known a technique in which a periphery of a substrate (hereinafter, also referred to as a "wafer") such as a semiconductor wafer is etched with a processing liquid (see Patent Document 1).

PRIOR ART DOCUMENT

Patent Document

Patent Document 1: Japanese Laid-Open Patent Publication No. 2016-54170

The present disclosure provides a technique capable of suppressing a substrate from being contaminated by a mist of a processing liquid or the like that remains around the substrate.

SUMMARY

A substrate processing apparatus according to an aspect of the present disclosure includes a substrate rotator, an outer cup, an inner cup, an annular drain, and an exhaust passage. The substrate rotator holds and rotates a substrate. The outer cup annularly covers a periphery of the substrate held by the substrate rotator. The inner cup is disposed inside the outer cup and under the substrate held by the substrate rotator. The annular drain is formed between the outer cup and the inner cup to discharge a processing liquid supplied to the substrate outward. The exhaust passage is formed inside the inner cup. The inner cup includes an exhaust hole through which a liquid reception space, which is formed by the inner cup and the outer cup, and the exhaust passage are in communication with each other. The exhaust hole is formed obliquely downward from an outer surface to an inner surface of the inner cup.

According to the present disclosure, it is possible to suppress a substrate from being contaminated by a mist of a processing liquid or the like that remains around the substrate.

DETAILED DESCRIPTION

Figure 1:
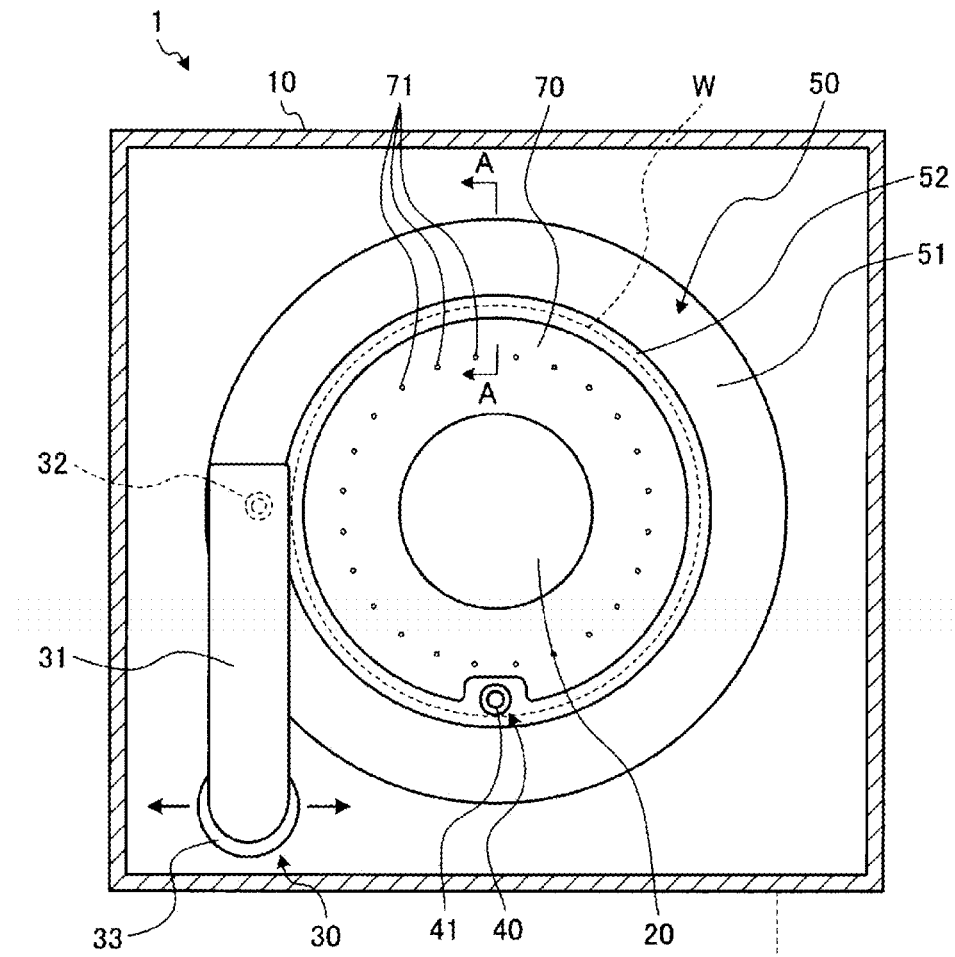
FIG. 1 is a schematic view illustrating a configuration of a substrate processing apparatus according to an embodiment.

Hereinafter, embodiments of a substrate processing apparatus and a substrate processing method disclosed herein will be described in detail with reference to the accompanying drawings. Further, the present disclosure is not limited to embodiments described below. In addition, it should be noted that the drawings are schematic, and the relationships between dimensions of respective elements, the ratios of the respective elements, and the like may differ from reality. Also, there may be a case where the relationships of dimensions and the ratios differ from each other between the drawings.

In each of the following embodiments, the same components will be denoted by the same reference numerals, and redundant descriptions thereof will be omitted. In each of the drawings to be referred to below, in order to facilitate ease of understanding the descriptions, an orthogonal coordinate system may be defined in which an X-axis direction, a Y-axis direction, and a Z-axis direction are orthogonal to one another, and the Z-axis positive direction is a vertically upward direction.

In the related art, there is known a technique in which a periphery of a substrate (hereinafter, also referred to as a "wafer") such as a semiconductor wafer is etched with a processing liquid. In etching such a periphery, by rotating the substrate at high speed, a swirling flow that flows outward from inward of a surface of the substrate may be made faster. This makes it possible to suppress droplets of an etching liquid from scattering inward from the periphery.

On the other hand, in the above-mentioned technology in the related art, since a pressure drop in the flow path formed outward from inward of a cup is relatively large, when the substrate is rotated at high speed, it is difficult to smoothly discharge the gas inside the cup, which becomes faster due to the swirling flow, outward of the cup. Therefore, there is a risk that the substrate may be contaminated by a mist of the processing liquid that remains around the substrate.

Therefore, there is a need to provide a technology that is capable of solving the above-mentioned matters to suppress a substrate from being contaminated by the mist of a processing liquid that remains around the substrate.

<Overall Configuration of Substrate Processing Apparatus>

Figure 2:
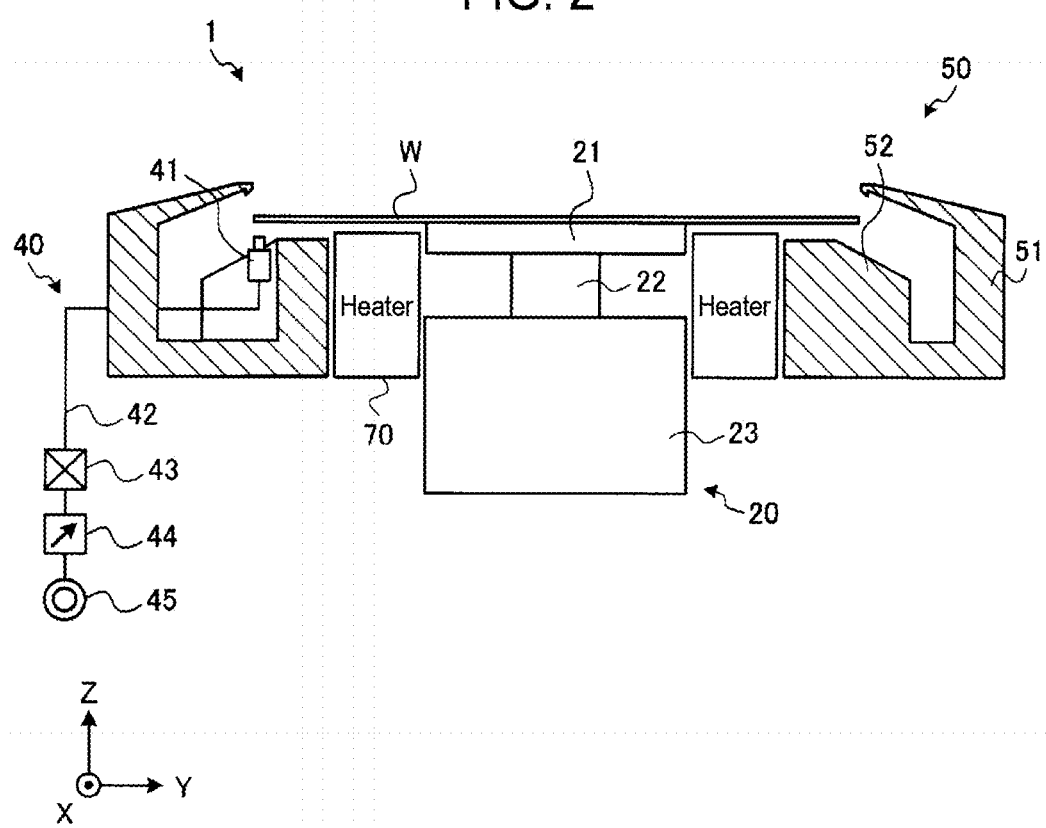
FIG. 2 is a schematic view illustrating the configuration of the substrate processing apparatus according to an embodiment.

First, a configuration of a substrate processing apparatus 1 according to an embodiment will be described with reference to FIGS. 1 and 2. FIGS. 1 and 2 are schematic views illustrating a configuration of the substrate processing apparatus 1 according to the embodiment.

As illustrated in FIGS. 1 and 2, the substrate processing apparatus 1 according to the embodiment includes a processing container 10, a substrate rotator 20, an upper supplier 30, a lower supplier 40, a recoverer 50, and a heater 70.

The processing container 10 accommodates the substrate rotator 20, the upper supplier 30, the lower supplier 40, the recoverer 50, and the heater 70.

The substrate rotator 20 rotatably holds a wafer W. Specifically, as illustrated in FIG. 2, the substrate rotator 20 includes a vacuum chuck 21, a shaft 22, and a driver 23. The vacuum chuck 21 attracts and holds the wafer W by evacuation. The vacuum chuck 21 has a smaller diameter than that of the wafer W, and attracts and holds a central portion of a lower surface of the wafer W.

The shaft 22 horizontally supports the vacuum chuck 21 at its tip. The driver 23 is connected to a base end portion of the shaft 22. The driver 23 rotates the shaft 22 around a vertical axis and raises and lowers the shaft 22 and the vacuum chuck 21 supported by the shaft 22.

As shown in FIG. 1, the upper supplier 30 supplies a processing liquid to an upper periphery of the wafer W to etch the upper periphery of the wafer W. This makes it possible, for example, to remove a film formed on the upper periphery of the wafer W, or to clean the upper periphery of the wafer W.

The upper periphery of the wafer W refers to an annular region on an upper surface of the wafer W, which has a width of, for example, about 1 to 5 mm from an edge of the upper surface.

The upper supplier 30 includes a nozzle arm 31, a nozzle 32, and a movement mechanism 33. The nozzle arm 31 extends in the horizontal direction (here, the Y-axis direction) and supports the nozzle 32 at its tip.

The nozzle 32 is arranged above the wafer W with its ejection port facing downward, and ejects a processing liquid such as a chemical liquid or a rinsing liquid onto the upper surface of the wafer W. As the chemical liquid, for example, hydrofluoric acid (HF), dilute hydrofluoric acid (DHF), nitrohydrofluoric acid, or the like may be used. The nitrohydrofluoric acid is a liquid mixture of hydrofluoric acid (HF) and nitric acid ($HNO_3$). In addition, as the rinsing liquid, for example, deionized water (DIW) may be used.

The movement mechanism 33 is connected to a base end portion of the nozzle arm 31. The movement mechanism 33 moves the nozzle arm 31, for example, along the horizontal direction (here, the X-axis direction). As a result, the movement mechanism 33 is able to move the nozzle 32 between a processing position above the periphery of the wafer W and a standby position outside the processing position.

The lower supplier 40 supplies the processing liquid to a lower periphery of the wafer W to etch the lower periphery of the wafer W. This makes it possible, for example, to remove a film formed on the lower periphery of the wafer W, or to clean the lower periphery of the wafer W.

The lower periphery of the wafer W refers to an annular region on a lower surface of the wafer W, which has a width of, for example, about 1 to 5 mm from an edge of the lower surface.

As illustrated in FIG. 2, the lower supplier 40 includes a lower nozzle 41, a pipe 42, a valve 43, a flow rate regulator 44, and a processing liquid source 45. The lower nozzle 41 is disposed below the wafer W and ejects the processing liquid upward toward the lower periphery of the wafer W.

The pipe 42 interconnects the lower nozzle 41 and the processing liquid source 45. The valve 43 is provided in the pipe 42 to open and close the pipe 42. The flow rate regulator 44 is provided in the pipe 42 to regulate a flow rate of the processing liquid flowing through the pipe 42. The processing liquid source 45 is, for example, a tank that stores the processing liquid.

The lower supplier 40 may include a movement mechanism configured to move the lower nozzle 41 in the horizontal direction. In this case, the lower supplier 40 may move the lower nozzle 41 between the processing position below the wafer W and the standby position outside the wafer W.

The recoverer 50 is provided to surround the outside of the wafer W and recovers droplets of the processing liquid scattered from the wafer W. In an embodiment, the recoverer 50 is provided with an outer cup 51 and an inner cup 52 to receive all the droplets scattered from the wafer W. The outer cup 51 is an example of a cup.

The outer cup 51 annularly covers the periphery of the wafer W held by the substrate rotator 20. For example, the outer cup 51 is provided to surround a lateral side of the wafer W, and is also provided to surround an upper portion outside the wafer W.

The inner cup is disposed inside the outer cup 51 and under the wafer W held by the substrate rotator 20. The inner cup 52 is disposed, for example, outside the heater 70.

The outer cup 51 and the inner cup 52 are made of a material with high chemical resistance, such as a fluororesin such as polytetrafluoroethylene (PTFE) or perfluoroalkoxyalkane (PFA).

Figure 3:
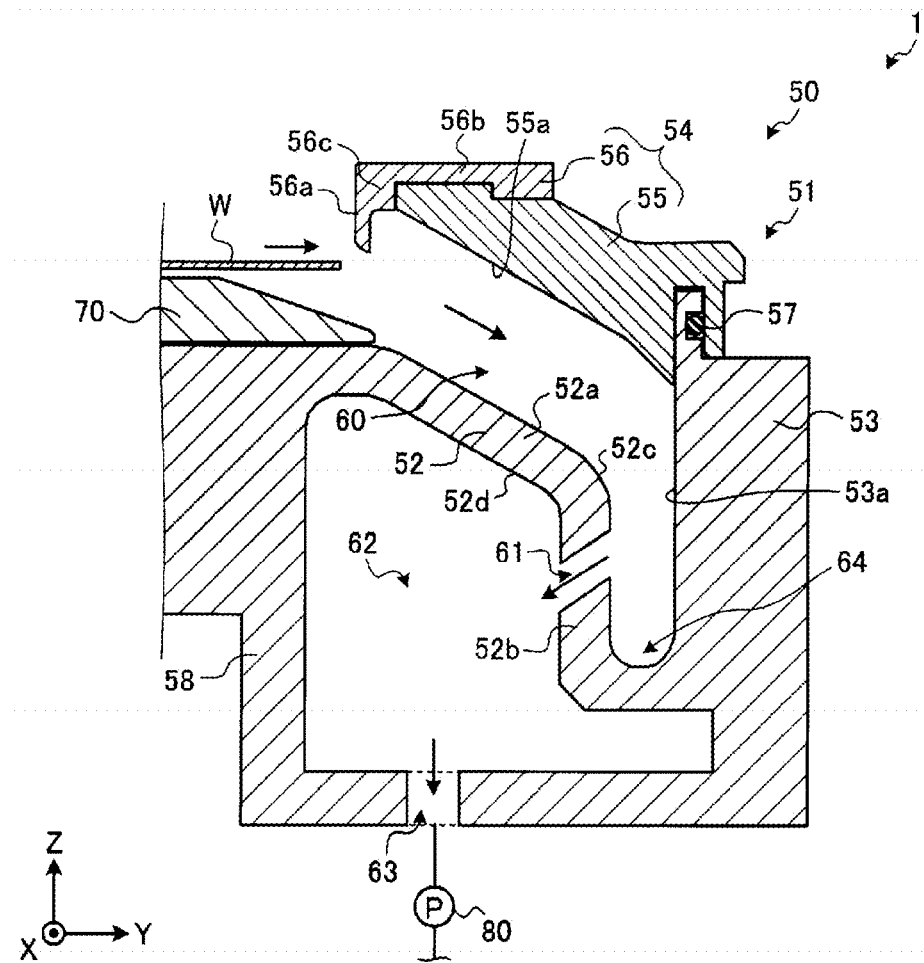
FIG. 3 is a cross-sectional view illustrating a configuration of a recoverer according to an embodiment.

The substrate processing apparatus 1 efficiently recovers droplets scattered from around the wafer W by suctioning the gas around the wafer W from the recoverer 50 with a pump 80 (see FIG. 3). Details of a mechanism for suctioning the gas will be described later.

The heater 70 is disposed below the wafer W and outside the substrate rotator 20. Specifically, the heater 70 is disposed between the substrate rotator 20 and the inner cup 52.

The heater 70 heats the lower periphery of the wafer W by supplying heated fluid toward the lower surface of the wafer W held by the substrate rotator 20. Specifically, as illustrated in FIG. 1, the heater 70 includes a plurality of injection ports 71 arranged side by side in a circumferential direction of the wafer W, and supplies the heated fluid toward the lower surface of the wafer W from the plurality of ejection ports 71.

In addition, the substrate processing apparatus 1 according to the embodiment includes a control device 11. The control device 11 is, for example, a computer, and includes a controller 12 and a storage 13.

The storage 13 is implemented by, for example, a semiconductor memory element such as a RAM or a flash memory, or a storage device such as a hard disk or an optical disk, and stores programs for controlling various processes executed in the substrate processing apparatus 1.

The controller 12 includes a microcomputer equipped with a central processing unit (CPU), a read only memory (ROM), a random access memory (RAM), an input/output port, and various other circuits. The controller 12 controls the operation of the substrate processing apparatus 1 by reading and executing the programs stored in the storage 13.

In addition, such programs may be stored in a computer-readable storage medium, and may be installed in the storage 13 of the control device 11 from the storage medium. The computer-readable storage medium is, for example, a hard disk (HD), a flexible disk (FD), a compact disk (CD), a magneto-optical disk (MO), a memory card, or the like.

EMBODIMENTS

Next, a detailed configuration and operation of the substrate processing apparatus 1 according to the embodiment will be described with reference to FIGS. 3 to 10. FIG. 3 is a cross-sectional view illustrating a configuration of the recoverer 50 according to the embodiment, specifically, a cross-sectional view taken along line A-A in FIG. 1.

As illustrated in FIG. 3, the recoverer 50 includes the outer cup 51, the inner cup 52, a liquid reception space 60, an exhaust hole 61, an exhaust passage 62, an exhaust port 63, and an annular drain 64. Further, the pump 80 is connected to the exhaust port 63.

By operating the pump 80, the substrate processing apparatus 1 exhausts the liquid reception space 60 defined by the outer cup 51 and the inner cup 52 via the exhaust hole 61, the exhaust passage 62, and the exhaust port 63. This makes it possible for the substrate processing apparatus 1 to exhaust an area around the wafer W via the liquid reception space 60 defined by the outer cup 51 and the inner cup 52.

The outer cup 51 is provided to surround an outer lateral side and an outer upper side of the wafer W. The outer cup 51 includes a cup base 53, an upper annular member 54, and an O-ring 57.

The cup base 53 surrounds the entire circumference of the substrate rotator 20 at the outermost periphery of the recoverer 50. The cup base 53 stands up substantially vertically to the same height as an upper end portion of the inner cup 52.

The upper annular member 54 is provided to surround the outer upper side of the wafer W. The upper annular member 54 is inclined to become higher inward from an upper end portion of the cup base 53 (that is, as the upper end portion approaches the wafer W).

The O-ring 57 is provided between the upper annular member 54 and the cup base 53 to seal a space between the upper annular member 54 and the cup base 53. In the present disclosure, the space between the upper annular member 54 and the cup base 53 may be sealed by a member other than the O-ring.

In addition, the upper annular member 54 includes a first member 55 and a second member 56. The first member 55 is detachably attached to the upper end portion of the cup base 53 and surrounds the outer periphery of the wafer W in an annular shape. An inner surface 55a of the first member 55 is hydrophilic and is inclined along an inclined portion 52a of the inner cup 52, which will be described later. That is, the inner surface 55a of the first member 55 is a hydrophilic surface.

In addition, in the present disclosure, the expression "a surface is hydrophilic" means that a contact angle at which the processing liquid adheres to the surface is 90 degrees or less, and the expression "a surface is hydrophobic" means that the contact angle at which the processing liquid adheres to the surface is 90 degrees or more.

The second member 56 is detachably installed to at least an inner peripheral end of the first member 55, and a surface 56a of the second member 56 is hydrophobic. That is, the surface 56a of the second member 56 is a hydrophobic surface. In addition, the second member 56 has a support portion 56b and a bent portion 56c.

The support portion 56b is a portion supported by the first member 55, and is supported by, for example, an upper end portion of the first member 55. The bent portion 56c is bent downward from an inner peripheral end of the support portion 56b with a given width (for example, about 3 mm) and extends in a direction approaching the periphery of the wafer W.

A lower end portion of the bent portion 56c is provided at a position higher than a height at which the wafer W is located by a given height (for example, about 2 mm). In addition, the lower end portion of the bent portion 56c is provided on an outer peripheral side of the bent portion 56c by a given distance (for example, about 5 mm) in the horizontal direction with respect to the periphery of the wafer W.

As described above, by providing a gap of a given size between the periphery of the wafer W and the lower end portion of the bent portion 56c, a space where the upper surface of the wafer W is exposed, and the liquid reception space 60 defined by the outer cup 51 and the inner cup 52 may be connected to each other.

Here, in the embodiment, the surface 56a of the second member 56, which is located near the lateral side of the wafer W and on which the processing liquid scattered from the wafer W abuts directly, is hydrophobic. This makes it possible to suppress the droplets of the processing liquid adhering to the second member 56 from gathering and becoming larger. Therefore, according to the embodiment, the processing liquid newly scattered from the wafer W collides with such large droplets so that the processing liquid may be suppressed from rebounding to the wafer W.

In addition, in the embodiment, the first member 55 and the second member 56, which directly receive the processing liquid scattered from the wafer W, are configured to be detachable from other adjacent members.

As a result, even when a surface condition of the wafer W or the type of processing liquid is changed in various forms in the substrate processing apparatus 1, surface conditions of the first member 55 and the second member 56 are optimized for various parameters that have been changed so that the processing liquid may be suppressed from rebounding to the wafer W.

Therefore, according to the embodiment, it is possible to suppress the processing liquid from rebounding from the outer cup 51 regardless of the surface conditions of the wafer W or the type of processing liquid.

In addition, in the embodiment, the inner surface 55a of the first member 55, which is an inclined surface, is preferably hydrophilic. This makes it possible to suppress the processing liquid, which has been scattered from the wafer W and adhered to the inner surface 55a of the first member 55, from being left on the inner surface 55a.

Therefore, according to the embodiment, it is possible to suppress the processing liquid left on the inner surface 55a from flowing backward to the wafer W, which suppresses the wafer W from being contaminated by the backwardly-flowing processing liquid.

In addition, in the embodiment, the inner surface 53a of the cup base 53 is preferably hydrophobic. This makes it possible to smoothly flow the processing liquid, which has reached the inner surface 53a of the cup base 53, to the annular drain 64 located below the inner surface 53a.

In addition, in the embodiment, the second member 56 closest to the wafer W in the outer cup 51 may have the bent portion 56c. As a result, a gap with a given size may be formed between the periphery of the wafer W and the outer cup 51. This makes it possible to smoothly exhaust the area around the wafer W through the liquid reception space 60.

In addition, in the embodiment, since the second member 56 has the bent portion 56c, the areas of the first member 55 and the second member 56 which are close to the periphery of the wafer W may be made small. As a result, an amount of the processing liquid adhering to the first member 55 and the second member 56 may be reduced.

Therefore, according to the embodiment, the processing liquid left on the inner surface 55a of the first member 55 and the surface 56a of the second member 56 may be suppressed from flowing backward to the wafer W, which suppresses the wafer W from being contaminated by the backwardly-flowing processing liquid.

Figure 4:
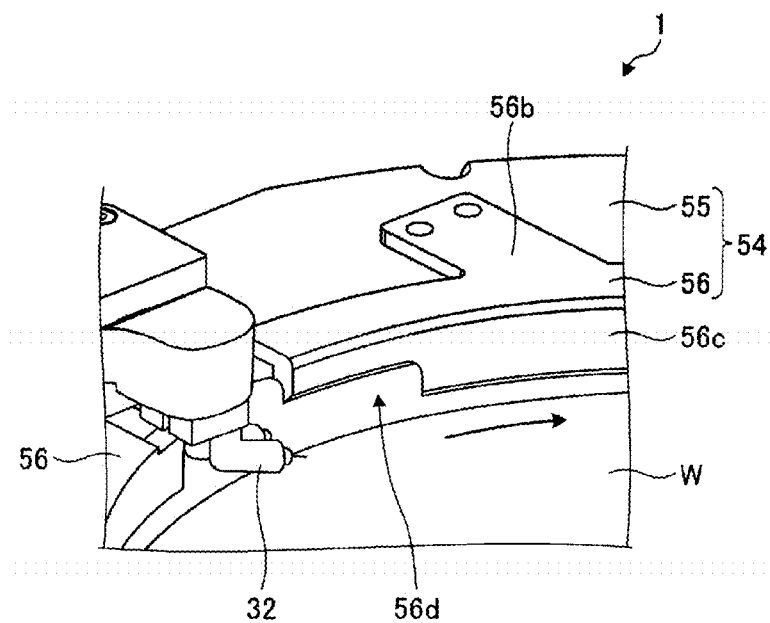
FIG. 4 is a perspective view illustrating a configuration of a second member according to an embodiment.

FIG. 4 is a perspective view illustrating a configuration of the second member 56 according to the embodiment. As illustrated in FIG. 4, the bent portion 56c of the second member 56 according to the embodiment is provided in an annular shape along the periphery of the wafer W.

The bent portion 56c according to the embodiment has an opening 56d through which the processing liquid supplied from the nozzle 32 and scattered from the wafer W flows toward the first member 55.

This makes it possible to suppress the processing liquid supplied from the nozzle 32 and scattered from the wafer W from directly contacting the bent portion 56c. Therefore, according to the embodiment, the processing liquid may be suppressed from rebounding from the bent portion 56c.

The opening 56d may be formed, for example, from the vicinity of the nozzle 32 in the second member 56 to a position at which the processing liquid supplied from the nozzle 32 and scattered from the wafer W does not directly contact the bent portion 56c. This makes it possible to suppress the processing liquid from rebounding from the bent portion 56c, and to suppress the processing liquid from flowing backward from the inner surface 55a of the first member 55.

Therefore, according to the embodiment, it is possible to further suppress the wafer W from being contaminated by the processing liquid scattered from the wafer W.

Figure 5:
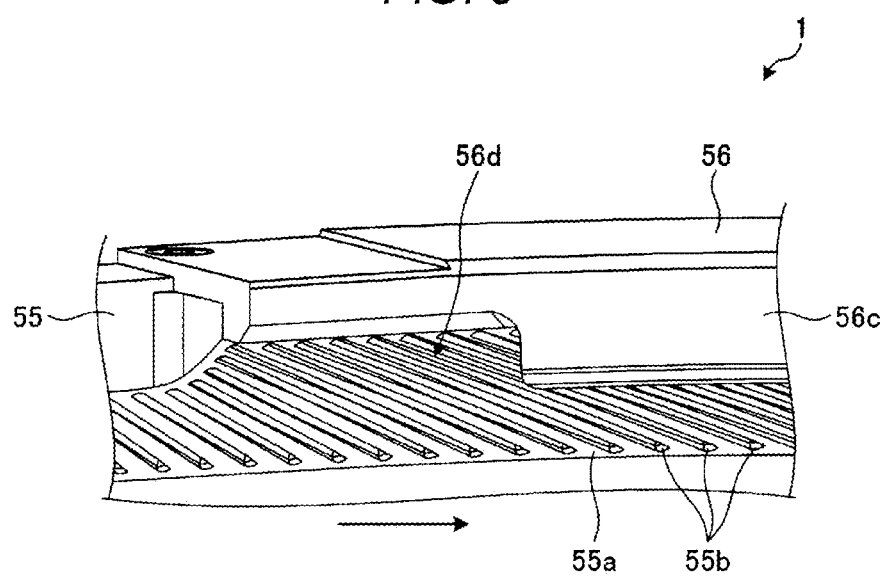
FIG. 5 is a perspective view illustrating a configuration of a first member according to an embodiment.

FIG. 5 is a perspective view illustrating a configuration of the first member 55 according to the embodiment. As illustrated in FIG. 5, a plurality of grooves 55b are provided in the inner surface 55a of the first member 55 according to the embodiment. The grooves 55b are formed along a flow direction in which the processing liquid supplied to the rotating wafer W is scattered outward.

As a result, the processing liquid adhering to the inner surface 55a of the first member 55 may be smoothly guided into the annular drain 64 by virtue of the swirling flow on the wafer W.

In addition, by providing the plurality of grooves 55b in the inner surface 55a, droplets of the processing liquid adhering to the inner surface 55a may be suppressed from gathering and becoming larger. Therefore, according to the embodiment, the processing liquid newly scattered from the wafer W collides with such large droplets so that the processing liquid may be suppressed from rebounding onto the wafer W.

The following returns to describing FIG. 3. The inner cup 52 is provided inside the outer cup 51 along the inner surface of the outer cup 51 (the inner surface 53a of the cup base 53 and the inner surface 55a of the first member 55).

That is, the inner cup 52 has the inclined portion 52a provided along the inner surface 55a of the first member 55, which is an inclined surface, and a vertical portion 52b provided along the inner surface 53a of the cup base 53, which is a vertical surface.

The inclined portion 52a gradually descends outward from the vicinity of the periphery of the wafer W. The vertical portion 52b extends downward from an outer peripheral end of the inclined portion 52a in a substantially vertical direction.

The liquid reception space 60 is formed between the outer cup 51 and the inner cup 52. The exhaust hole 61 is formed to pass through the inner cup 52. The exhaust passage 62 is formed inside the inner cup 52.

The exhaust passage 62 is formed, for example, between the inner cup 52 and the wall 58 located inside and below the inner cup 52. The exhaust passage 62 and the liquid reception space 60 are connected to each other via the exhaust hole 61.

The exhaust port 63 is connected to the exhaust passage 62. The exhaust port 63 is provided at, for example, a predetermined position in the wall 58. The exhaust port 63 may be provided at one location or multiple locations on the wall 58. In addition, details of an exhaust duct 100 (see FIG. 10) on a downstream side of the exhaust port 63 will be described later.

The annular drain 64 is formed between the outer cup 51 and the inner cup 52 (for example, between a lower end portion of the outer cup 51 and a lower end portion of the inner cup 52). The annular drain 64 discharges the processing liquid supplied to the wafer W to the outside. Details of the annular drain 64 will be described later.

Here, in the embodiment, the exhaust hole 61 is formed obliquely downward from the outer surface 52*c* of the inner cup 52 to the inner surface 52*d*. This makes it possible to smoothly flow the gas from the liquid reception space 60 toward the exhaust passage 62, which efficiently exhausts the area around the wafer W.

Therefore, according to the embodiment, the wafer W may be suppressed from being contaminated by the mist of the processing liquid remaining around the wafer W.

Further, in the embodiment, the exhaust hole 61 may be provided in the vertical portion 52*b* of the inner cup 52. This makes it possible to suppress the processing liquid, which is dropped along the outer surface 52*c* of the inner cup 52, from flowing into the exhaust hole 61 rather than the annular drain 64.

Therefore, according to the embodiment, the processing liquid dropped down along the inner cup 52 may be separated effectively.

Figure 6:
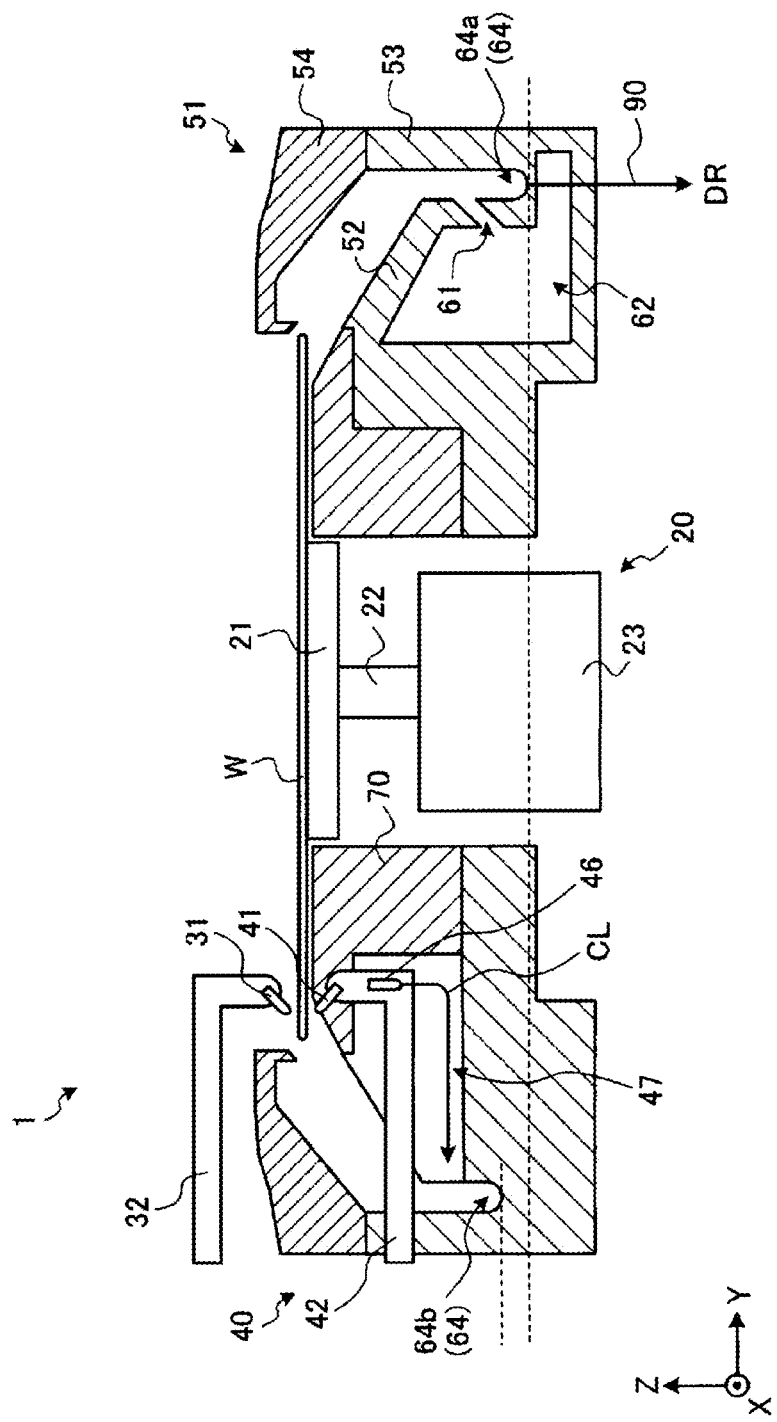
FIG. 6 is a cross-sectional view illustrating a configuration of an annular drain according to an embodiment.
Figure 7:
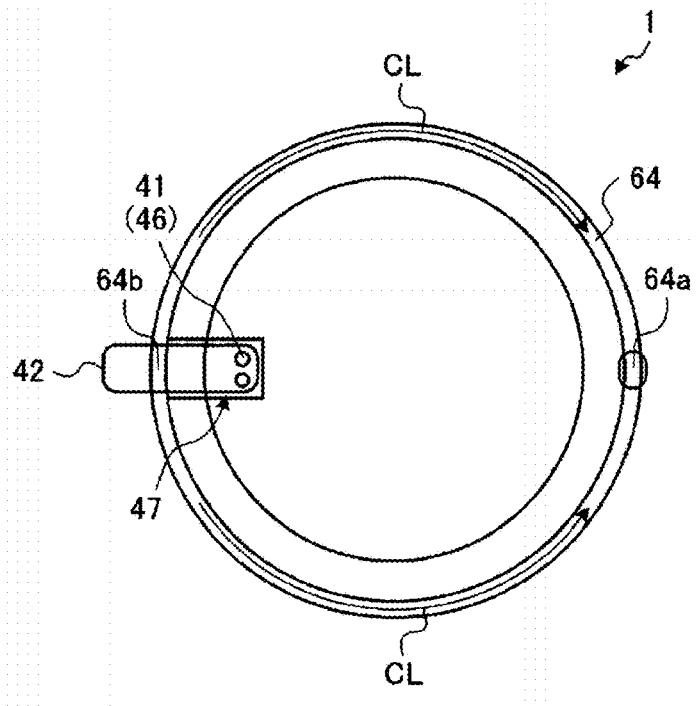
FIG. 7 is a plan view illustrating the configuration of the annular drain according to an embodiment.

FIG. 6 is a cross-sectional view illustrating a configuration of the annular drain 64 according to the embodiment, and FIG. 7 is a plan view illustrating the configuration of the annular drain 64 according to the embodiment. As illustrated in FIG. 7, the annular drain 64 has an annular shape (for example, a circular annular shape) in a plan view.

In addition, a drain port 64*a* is provided in a lower surface of the annular drain 64 at a given position. The drain port 64*a* is connected to a drain portion DR via a drain path 90.

Further, in the embodiment, as illustrated in FIG. 6 and the like, a cleaning liquid nozzle 46 is provided in the lower supplier 40. The cleaning liquid nozzle 46 is provided in the vicinity of the lower nozzle 41 to eject a cleaning liquid CL downward.

The cleaning liquid CL ejected from the cleaning liquid nozzle 46 is supplied to the cleaning liquid supply portion 64*b* of the annular drain 64 via a groove 47 formed in the inner cup 52. The cleaning liquid CL according to the embodiment is, for example, DIW.

Further, as illustrated in FIG. 7, since the cleaning liquid nozzle 46 is provided at a position facing the drain port 64*a*, the cleaning liquid supply portion 64*b* is provided at a position facing the drain port 64*a*.

Here, in an embodiment, the drain port 64*a* is provided at the lowest position in the annular drain 64, and the cleaning liquid supply portion 64*b* is provided at the highest position. The annular drain 64 is formed such that the annular drain becomes gradually lower from the cleaning liquid supply portion 64*b* toward the drain port 64*a*.

As a result, as illustrated in FIG. 7, the cleaning liquid CL supplied from the cleaning liquid nozzle 46 to the cleaning liquid supply portion 64*b* flows through the entire annular drain 64 and is discharged from the drain port 64*a*. That is, in the embodiment, by supplying the cleaning liquid CL toward the cleaning liquid supply portion 64*b* from the cleaning liquid nozzle 46 provided at a position facing the drain port 64*a*, the entire annular drain 64 may be cleaned effectively.

In the embodiment, by operating the cleaning liquid nozzle 46 to clean the annular drain 64, the amount of the mist of the processing liquid remaining in the liquid reception space 60 may be reduced. Therefore, according to the embodiment, the mist remaining in the liquid reception space 60 may be suppressed from flowing backward and contaminating the wafer W.

Figure 8:
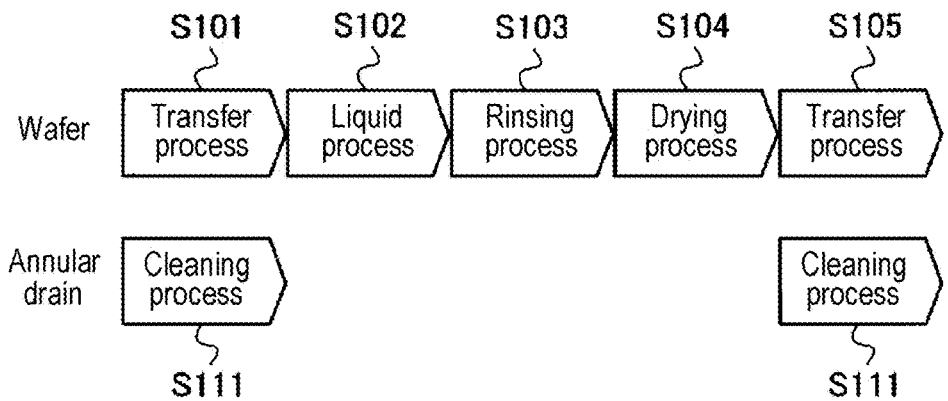
FIG. 8 is a timing chart illustrating an example of a cleaning process on the annular drain according to an embodiment.

FIG. 8 is a timing chart illustrating an example of a cleaning process on the annular drain 64 according to the embodiment. As illustrated in FIG. 8, in the substrate processing apparatus 1 (see FIG. 1), various processes are performed on one sheet of wafer W.

For example, the controller 12 (see FIG. 1) first performs a transfer process of unloading the wafer W subjected to various processes from the processing container 10 (see FIG. 1), and loading a next wafer W into the processing container 10 (step S101).

Subsequently, the controller 12 performs various liquid processes on the periphery of the wafer W loaded into the processing container 10 (step S102). Then, the controller 12 performs a rinsing process on the wafer W subjected to various liquid processes (step S103). Such a rinsing process is performed, for example, by supplying DIW to the wafer W from the nozzle 32 and the lower nozzle 41.

Subsequently, the controller 12 performs a drying process on the wafer W subjected to the rinsing process (step S104). Such a drying process is performed, for example, by rotating the wafer W at high speed.

Finally, the controller 12 performs a transfer process of unloading the wafer W subjected to a series of processes described above from the processing container 10, and loading a next wafer W into the processing container 10 (step S105).

Here, in the example of FIG. 8, the controller 12 performs a cleaning process on the annular drain 64 (step S111) in parallel with the transfer process for the wafer W (steps S101 and S105).

In this way, by performing the cleaning process on the annular drain 64 in parallel with the transfer process for the wafer W, even if the amount of the mist of the processing liquid remaining in the liquid reception space 60 during such a drain cleaning process temporarily increases, the wafer W may be suppressed from being contaminated.

Figure 9:
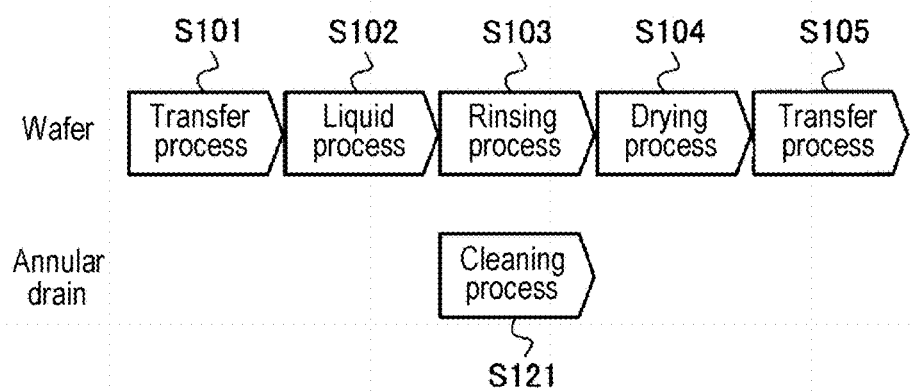
FIG. 9 is a timing chart illustrating another example of the cleaning process on the annular drain according to an embodiment.

FIG. 9 is a timing chart illustrating another example of the cleaning process on the annular drain 64 according to the embodiment. In the example of FIG. 9, the controller 12 performs the cleaning process on the annular drain 64 (step S121) in parallel with the rinsing process on the wafer W (step and S103). In the example illustrated in FIG. 9, for example, DIW is ejected from the nozzle 32, the lower nozzle 41, and the cleaning liquid nozzle 46 at the same time.

In this way, since the cleaning process on the annular drain 64 is performed in parallel with the rinsing process for the wafer W, there is no need for various processes of the wafer W to standby until the drain cleaning process ends. This shortens the total processing time required to process the wafer W.

Figure 10:
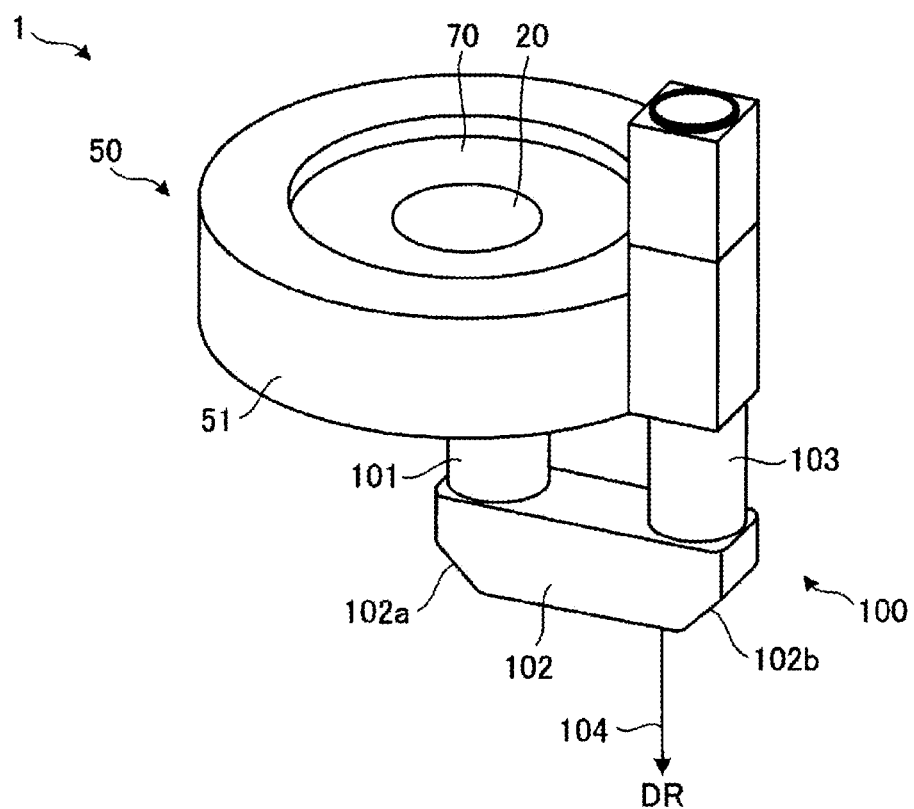
FIG. 10 is a perspective view illustrating a configuration of an exhaust duct according to an embodiment.

FIG. 10 is a perspective view illustrating a configuration of the exhaust duct 100 according to the embodiment. In FIG. 10, illustration of portions other than the substrate rotator 20, the recoverer 50, the heater 70, and the exhaust duct 100 is omitted.

As illustrated in FIG. 10, the exhaust duct 100 is connected to the exhaust port 63 (see FIG. 3) of the recoverer 50, and discharges the exhaust gas in the exhaust passage 62 to the pump 80 (see FIG. 3). The exhaust duct 100 includes a descending portion 101, a horizontal portion 102, and an ascending portion 103 in the named order from the upstream side.

The descending portion 101 of a cylindrical shape is a portion which is connected to the exhaust port 63 of the recoverer 50 and extends downward. The horizontal portion 102 of a box shape is connected to a downstream side of the descending portion 101 and extends away from the recoverer 50 in the horizontal direction.

The ascending portion 103 of a cylindrical shape is a portion connected to a downstream side of the horizontal portion 102 and extends upward. In addition, the ascending portion 103 extends above the recoverer 50. In addition, since the downstream side of the horizontal portion 102 extends outward of the recoverer 50 in a plan view, the exhaust duct 100 does not interfere with the recoverer 50 even if the ascending portion 103 extends above the recoverer 50.

As described so far, the exhaust duct 100 according to the embodiment may be connected to the lower side of the recoverer 50 and may extend upward of the recoverer 50. This makes it possible to suppress the droplets, which have reached the exhaust passage 62, from being discharged outward from the exhaust port 63 via the exhaust duct 100.

That is, in the embodiment, the droplets that have reached the exhaust passage 62 may be separated effectively by the exhaust duct 100.

In addition, in an embodiment, a drain path 104, which is connected to the drain part DR, may be connected to the lower surface of the horizontal portion 102. As a result, since the droplets, which have reached the horizontal portion 102, may be discharged to the drain portion DR, the droplets, which have reached the horizontal portion 102, may be separated more effectively by the exhaust duct 100.

In addition, in an embodiment, the horizontal portion 102 of the exhaust duct 100 may have a box shape. Thus, the exhaust duct 100 may be implemented by connecting the descending portion 101 and the ascending portion 103, which are linear pipes, to the box-shaped horizontal portion 102. Therefore, according to the embodiment, the manufacturing cost of the exhaust duct 100 may be reduced.

In addition, in an embodiment, the inclined portion 102a may be provided below a portion connected to the descending portion 101 in the box-shaped horizontal portion 102. This makes it possible to suppress an eddy flow from occurring at the portion connected to the descending portion 101. The eddy flow occurs when an exhaust direction is changed from a downward direction to a horizontal direction.

Therefore, according to the embodiment, a pressure loss in the exhaust duct 100 may be further reduced. This makes it possible to further reduce a flow path resistance of the entire exhaust path leading from the periphery of the wafer W to the pump 80.

In addition, in an embodiment, the inclined portion 102b may be provided below a portion connected to the ascending portion 103 in the box-shaped horizontal portion 102. This makes it possible to suppress a vortex flow from occurring at the portion connected to the ascending section 103. The vortex flow occurs when the exhaust direction is changed from the horizontal direction to an upward direction.

Therefore, according to the embodiment, a pressure loss in the exhaust duct 100 may be further reduced. This further reduces the flow path resistance of the entire exhaust path leading from the periphery of the wafer W to the pump 80.

In an embodiment, an inner diameter of the ascending portion 103 may be substantially equal to an inner diameter of the descending portion 101, or may be larger than the inner diameter of the descending portion 101. In an embodiment, by making the inner diameter of the ascending portion 103 larger than the inner diameter of the descending portion 101, the pressure loss in the exhaust duct 100 may be further reduced.

Further, in an embodiment, inner dimensions of the box-shaped horizontal portion 102 may be set to be larger than the inner diameters of the cylindrical descending portion 101 and ascending portion 103. This makes it possible to connect the descending portion 101 and the ascending portion 103 to the horizontal portion 102 with no problem.

On the other hand, when the inner dimensions of the horizontal portion 102 are excessively larger than the inner diameters of the descending portion 101 and the ascending portion 103, at the connection portion between the descending portion 101 and the horizontal portion 102 and the connection portion between the horizontal portion 102 and the ascending portion 103, many vortex flows occur due to the rapid expansion and contraction of the cross-sectional area of the flow path. Therefore, in an embodiment, the cross-sectional area of the horizontal portion 102 may be twice or less than those of the descending portion 101 and the ascending portion 103.

<Modification 1>

Figure 11:
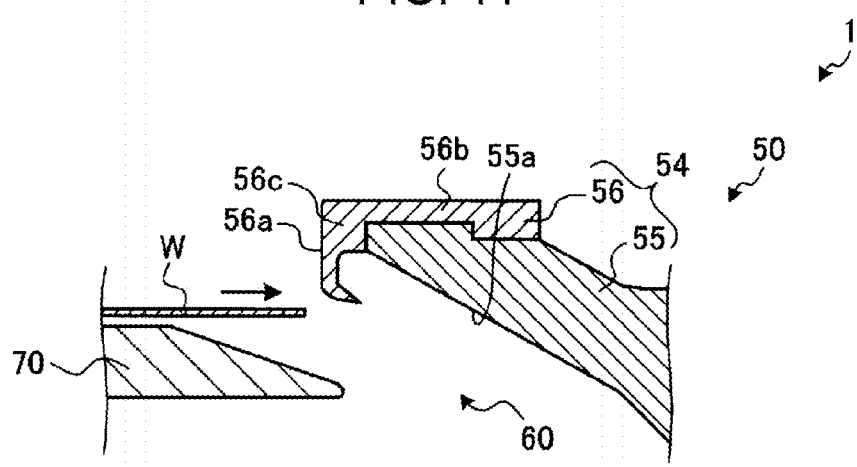
FIG. 11 is a cross-sectional view illustrating a configuration of an upper annular member according to Modification 1 of the embodiment.

Next, various modifications of the substrate processing apparatus 1 according to the embodiment will be described with reference to FIGS. 11 to 17. FIG. 11 is a cross-sectional view illustrating a configuration of an upper annular member 54 according to Modification 1 of the embodiment.

As illustrated in FIG. 11, the upper annular member 54 according to Modification 1 differs in the configuration of the second member 56 from the above-described embodiment. Specifically, in Modification 1, the tip of the bent portion 56c of the second member 56 is bent further outward.

As a result, in Modification 1, the droplets of the processing liquid, which adhere to the tip of the bent portion 56c, may be moved away from the wafer W. Therefore, according to Modification 1, the wafer W may be suppressed from being contaminated by droplets which adhere to the tip of the bent portion 56c.

In addition, in Modification 1, the tip of the bent portion 56c may cover the inner peripheral end of the first member 55 from below. Since the inner peripheral end is a boundary between the inner surface 55a as a hydrophilic surface and the surface 56a as a hydrophobic surface, it is possible to suppress droplets of the processing liquid from scattering at the inner peripheral end of the first member 55, where droplets tend to gather.

Therefore, according to Modification 1, it is possible to suppress the wafer W from being contaminated by the droplets adhering to the inner peripheral end of the first member 55.

<Modification 2>

Figure 12:
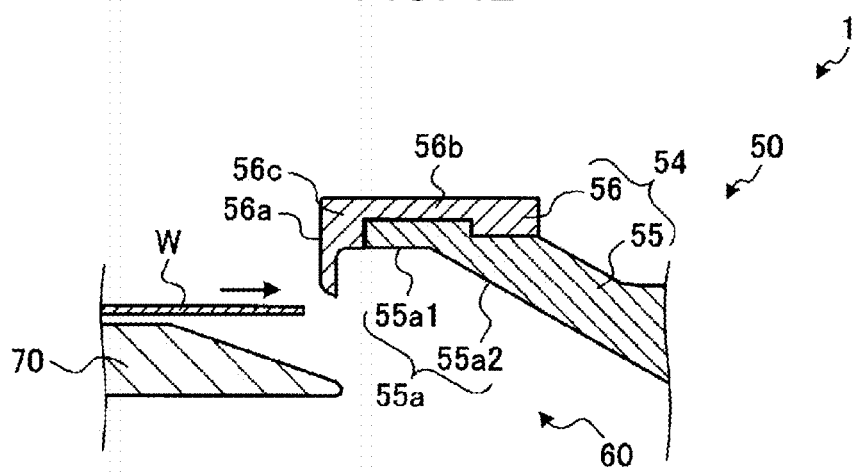
FIG. 12 is a cross-sectional view illustrating a configuration of an upper annular member according to Modification 2 of the embodiment.

FIG. 12 is a cross-sectional view illustrating a configuration of an upper annular member 54 according to Modification 2 of the embodiment. As illustrated in FIG. 12, the upper annular member 54 according to Modification 2 differs in the configuration of the first member 55 from the above-described embodiment.

Specifically, in Modification 2, the inner surface 55a of the first member 55 includes a horizontal portion 55a1 and an inclined portion 55a2. The horizontal portion 55a1 is a surface extending substantially horizontally from the inner surface of the second member 56.

The inclined portion 55a2 is inclined to become lower outward from the outermost periphery of the horizontal portion 55a1. In addition, an inclination angle of the inclined portion 55a2 in Modification 2 is substantially equal to that of the inner surface 55a in the embodiment.

As a result, in Modification 2, droplets of the processing liquid, which adhere to the inner surface 55a of the first member 55, may be moved away from the wafer W. Therefore, according to Modification 2, it is possible to suppress the wafer W from being contaminated by the droplets adhering to the inner surface 55a.

<Modification 3>

Figure 13:
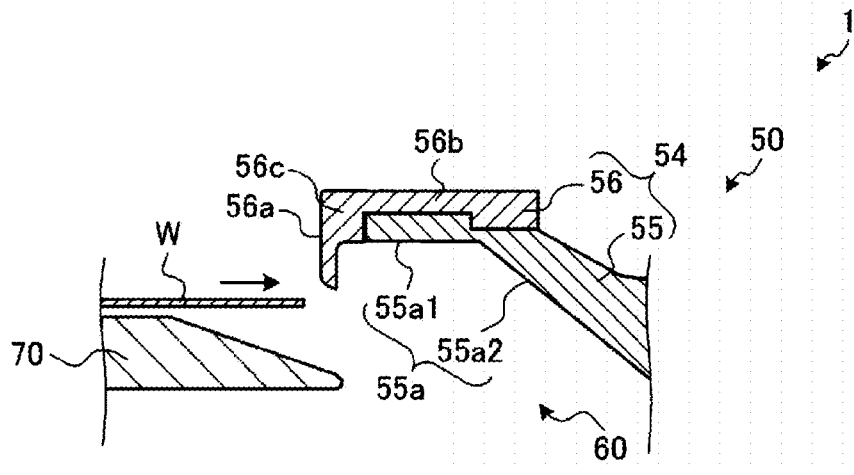
FIG. 13 is a cross-sectional view illustrating a configuration of an upper annular member according to Modification 3 of the embodiment.

FIG. 13 is a cross-sectional view illustrating a configuration of an upper annular member 54 according to Modification 3 of the embodiment. As illustrated in FIG. 13, the upper annular member 54 according to Modification 3 differs in the configuration of the first member 55 from Modification 2.

The horizontal portion 55a1 of Modification 3 extends further toward the outer periphery than the horizontal portion of Modification 2. In addition, the inclination angle of the inclined portion 55a2 in Modification 3 is larger than that of the inclined portion 55a2 in Modification 2.

As a result, in Modification 3, droplets of the processing liquid, which adhere to the inner surface 55a of the first member 55, may be further moved away from the wafer W. Therefore, according to Modification 3, it is possible to further suppress the wafer W from being contaminated by the droplets adhering to the inner surface 55a.

<Modification 4>

Figure 14:
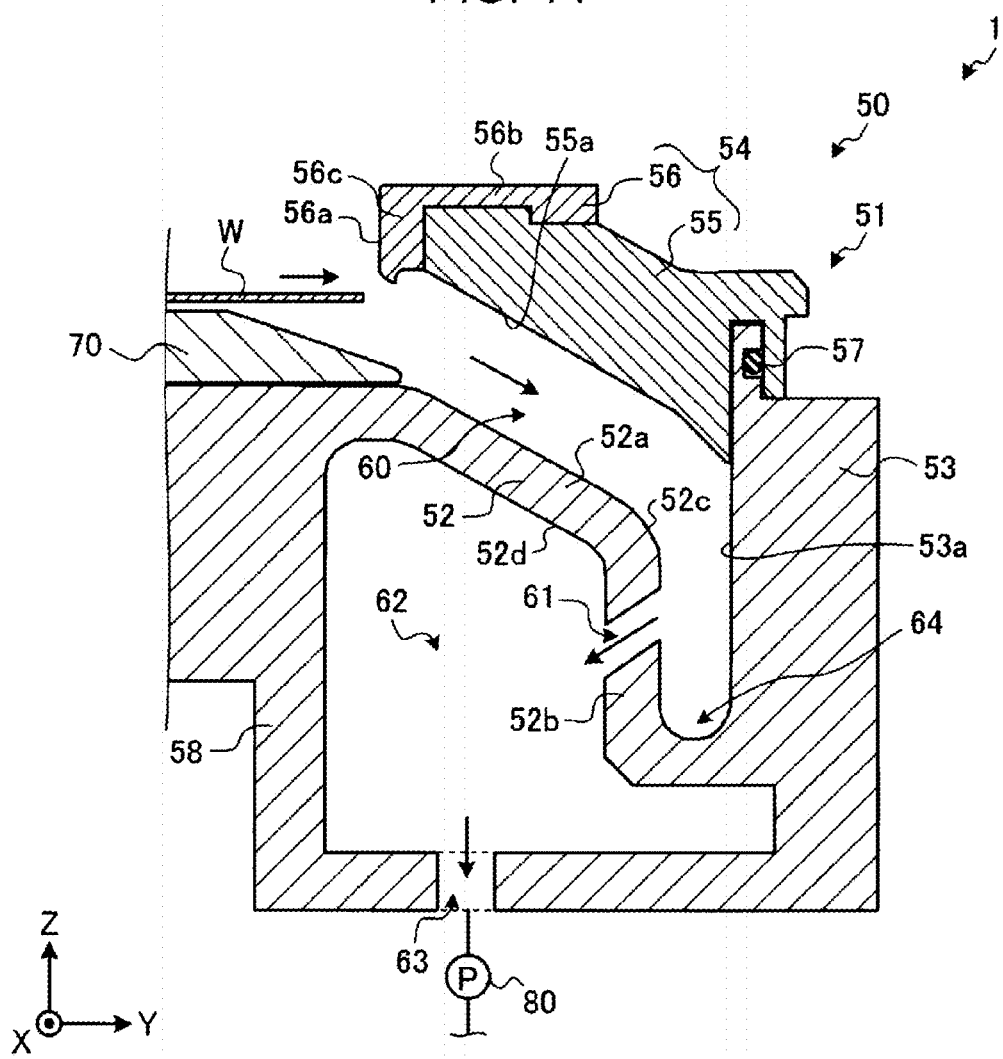
FIG. 14 is a cross-sectional view illustrating a configuration of a recoverer according to Modification 4 of the embodiment.

FIG. 14 is a cross-sectional view illustrating a configuration of a recoverer 50 according to Modification 4 of the embodiment. As illustrated in FIG. 14, the recoverer 50 according to Modification 4 differs in the configuration of the upper annular member 54 from the above-described embodiment.

Specifically, in Modification 4, a protrusion length of the bent portion 56c of the second member 56 is shorter than that in the embodiment. For example, in Modification 4, a downward protrusion length of the bent portion 56c (see FIG. 3) is about 3 mm.

As a result, in Modification 4, it is possible to suppress the liquid reception space 60 from being excessively formed on the rear side of the bent portion 56c, which reduces a level of vortex flows generated in the excessive liquid reception space 60. Therefore, according to Modification 4, this makes it possible to smoothly flow the gas from the wafer W toward the exhaust hole 61.

<Modification 5>

Figure 15:
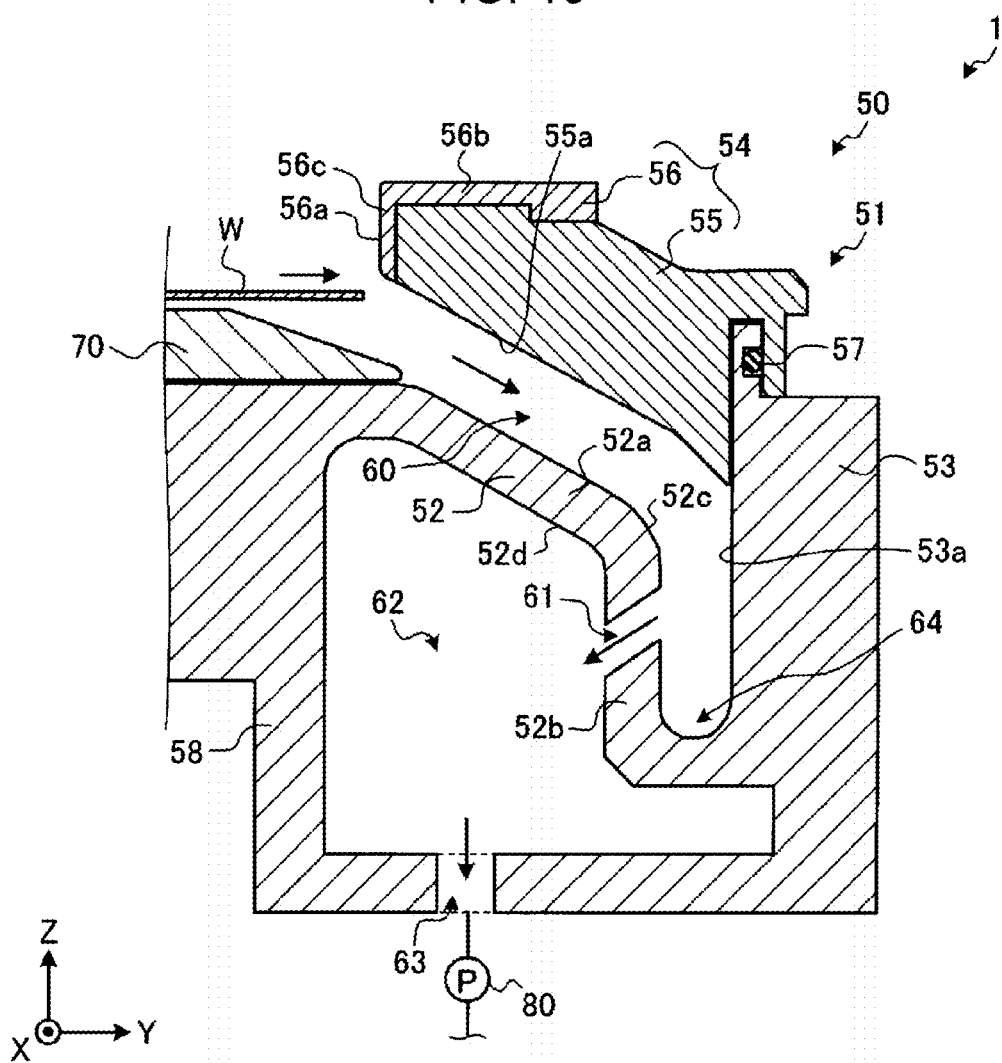
FIG. 15 is a cross-sectional view illustrating a configuration of a recoverer according to Modification 5 of the embodiment.

FIG. 15 is a cross-sectional view illustrating a configuration of a recoverer 50 according to Modification 5 of the embodiment. As illustrated in FIG. 15, the recoverer 50 according to Modification 5 differs in the configuration of the upper annular member 54 from the above-described embodiment.

Specifically, in Modification 5, the bent portion 56c of the second member 56 does not protrude downward, and the inner surface 55a of the first member 55 directly extends outward from the lower end portion of the bent portion 56c.

As a result, in Modification 5, it is possible to suppress the liquid reception space 60 from being excessively formed on the rear side of the bent portion 56c, which further reduces the level of vortex flows generated in the excessive liquid reception space 60. Therefore, according to Modification 5, it is possible to more smoothly flow the gas from the wafer W toward the exhaust hole 61.

<Modification 6>

Figure 16:
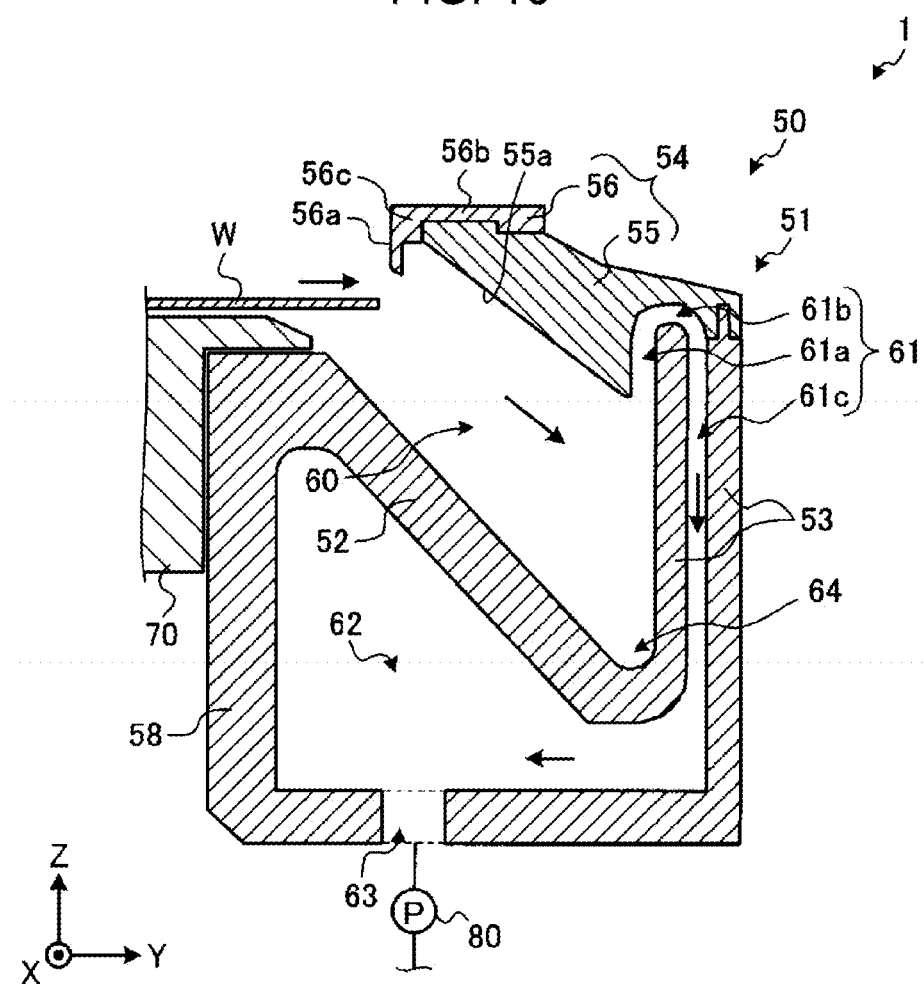
FIG. 16 is a cross-sectional view illustrating a configuration of a recoverer according to Modification 6 of the embodiment.

FIG. 16 is a cross-sectional view illustrating a configuration of a recoverer 50 according to Modification 6 of the embodiment. In the embodiment and various modifications described so far, examples have been illustrated in which the exhaust hole 61 interconnecting the liquid reception space 60 and the exhaust passage 62 is provided in the inner cup 52, but the present disclosure is not limited to such examples.

For example, as illustrated in FIG. 16, the exhaust hole 61 may be provided in the outer cup 51. The exhaust hole 61 has an ascending portion 61a, a bent portion 61b, and a descending portion 61c. The ascending portion 61a extends upward between the cup base 53 and the upper annular member 54 from the upper end portion of the outermost periphery in the liquid reception space 60.

The bent portion 61b is bent downward between the cup base 53 and the upper annular member 54 from the downstream end portion of the ascending portion 61a. The descending portion 61c extends downward inside the cup base 53 from the downstream end portion of the bent portion 61b. In addition, the downstream side of the descending portion 61c is connected to the exhaust passage 62.

Even if the exhaust hole 61 has such a configuration, since both the first member 55 and the second member 56 are configured to be detachable from other members, the surface conditions of the first member 55 and the second member 56 may be optimized even when the surface conditions of the wafer W and the type of processing liquid are variously changed.

Therefore, according to Modification 6, it is possible to suppress the processing liquid from rebounding from the outer cup 51 regardless of the surface conditions of the wafer W or the type of processing liquid.

In addition, in Modification 6, since the ascending portion 61a is provided on the upstream side of the exhaust hole 61, droplets of the processing liquid may be suppressed from entering the exhaust hole 61. Therefore, according to the embodiment, it is possible to effectively separate the droplets that have reached the exhaust hole 61 in the ascending portion 61a.

<Modification 7>

Figure 17:
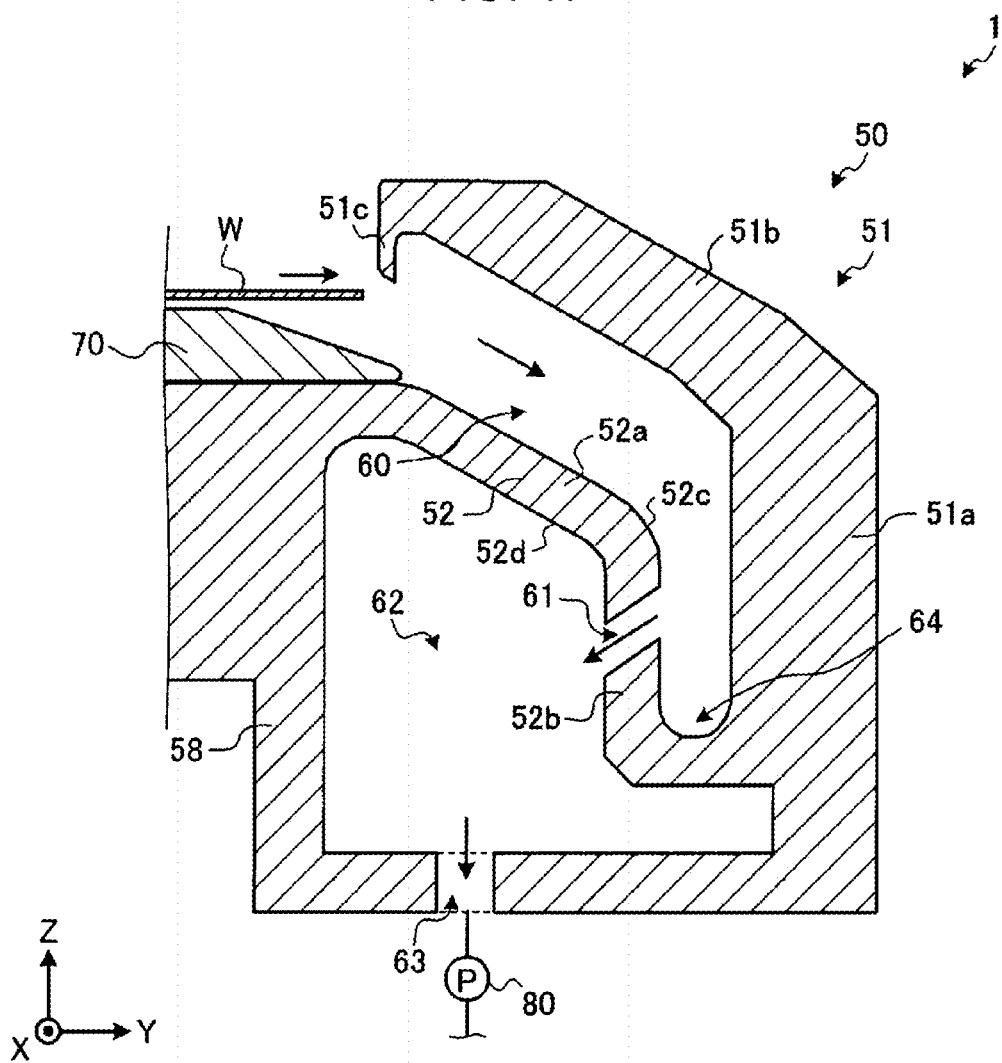
FIG. 17 is a cross-sectional view illustrating a configuration of a recoverer according to Modification 7 of the embodiment.

FIG. 17 is a cross-sectional view illustrating a configuration of a recoverer 50 according to Modification 7 of the embodiment. In the embodiment and various modifications described so far, examples have been illustrated in which the upper annular member 54 of the outer cup 51 is configured to be detachable, but the present disclosure is not limited to such examples.

For example, as illustrated in FIG. 17, the outer cup 51 may be constructed in one piece. The outer cup 51 has a base portion 51a, an upper annular portion 51b, and a bent portion 51c.

The base portion 51a surrounds the entire periphery of the substrate rotator 20 at the outermost periphery of the recoverer 50. The base portion 51a rises substantially vertically to the same height as the upper end portion of the inner cup 52.

The upper annular portion 51b is provided to surround the outer upper portion of the wafer W. The upper annular portion 51b is inclined to become higher inward from the upper end portion of the base portion 51a (that is, as the upper end portion approaches the wafer W)

The bent portion 51c is bent from the inner peripheral end of the upper annular portion 51b with a given width (for example, about 3 mm) and extends in a direction approaching the periphery of the wafer W.

Even if the outer cup 51 has such a configuration, the exhaust hole 61 is formed obliquely downward from the outer surface 52c to the inner surface 52d of the inner cup 52 so that a flow of the gas flowing from the liquid reception space 60 toward the exhaust passage 62 may become smooth.

Therefore, according to Modification 7, the area around the wafer W may be effectively exhausted. This makes it possible to suppress the wafer W from being contaminated by the mist of the processing liquid remaining around the wafer W.

In addition, in Modification 7, the exhaust hole 61 may be disposed in the vertical portion 52*b* of the inner cup 52, as in the above-described embodiment. This makes it possible to suppress the processing liquid, which is dropped along the outer surface 52*c* of the inner cup 52, from flowing into the exhaust hole 61 rather than the annular drain 64.

Therefore, according to Modification 7, it is possible to effectively separate the processing liquid dropped along the inner cup 52.

<Modification 8>

Figure 18:
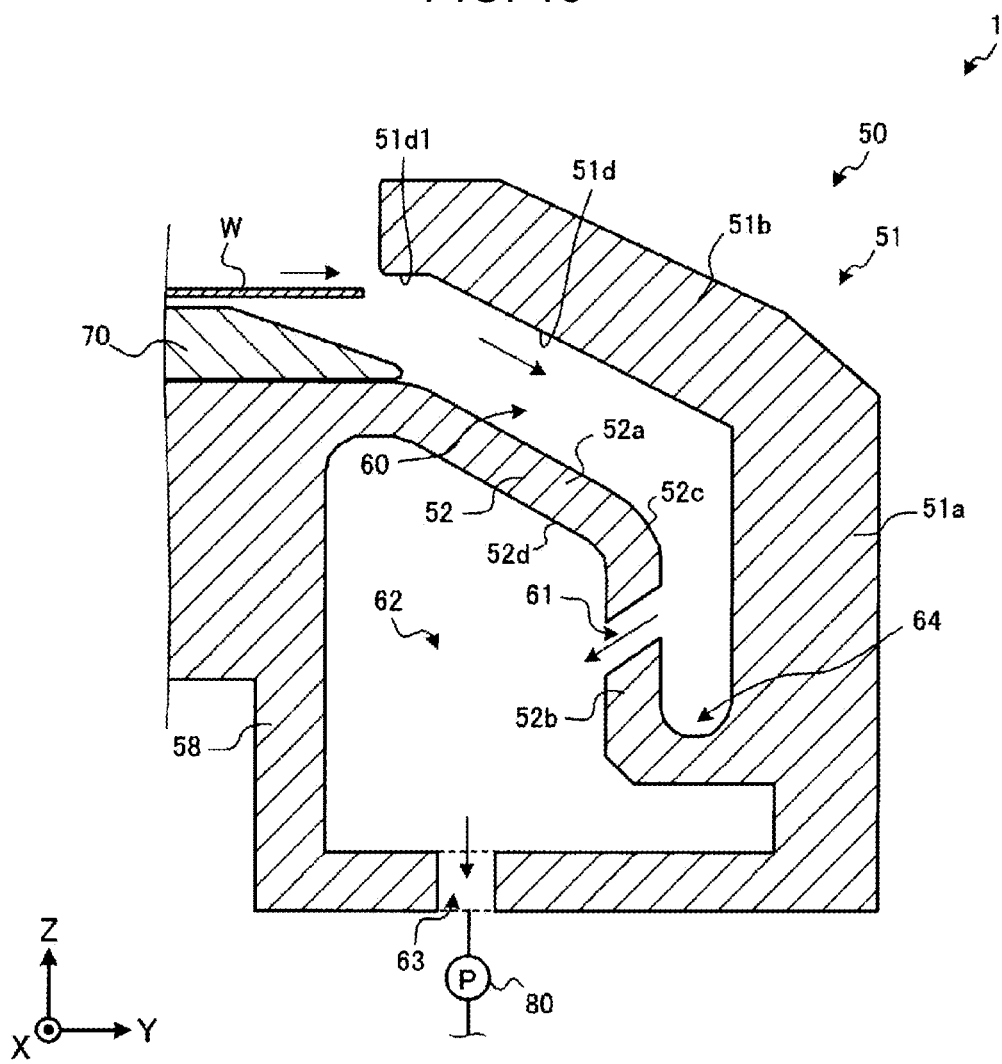
FIG. 18 is a cross-sectional view illustrating a configuration of a recoverer according to Modification 8 of the embodiment.

FIG. 18 is a cross-sectional view illustrating a configuration of a recoverer 50 according to Modification 8 of the embodiment. In the embodiment and various modifications described so far, examples have been illustrated in which the outer cup 51 is provided with the bent portion 56*c* or the bent portion 51*c*, but the present disclosure is not limited to such examples.

For example, as illustrated in FIG. 18, in the outer cup 51 configured as one piece, the outer cup 51 may be constituted with the base portion 51*a* and the upper annular portion 51*b*.

In Modification 8, the inner surface 51*d* of the outer cup 51 has a horizontal portion 51*d*1 that extends horizontally outward from a location closest to the wafer W (for example, the inner peripheral end of the outer cup 51).

As a result, since the swirling flow on the wafer W directed outward from the wafer W may be made to follow the horizontal portion 51*d*1, the processing liquid adhering to the horizontal portion 51*d*1 may be smoothly guided into the annular drain 64 by using the swirling flow on the wafer W.

Therefore, according to Modification 8, it is possible to suppress the processing liquid left on the horizontal portion 51*d*1 from flowing backward to the wafer W, thus suppressing the wafer W from being contaminated by the backwardly-flowing processing liquid.

Figure 19:
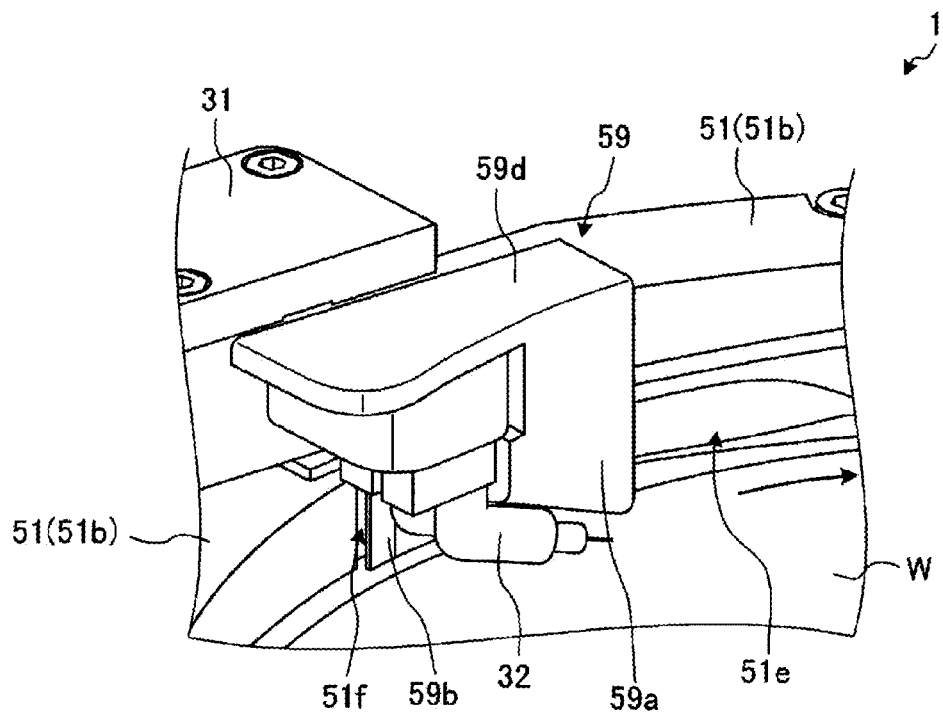
FIG. 19 is a perspective view illustrating a configuration of a cover according to Modification 8 of the embodiment.
Figure 20:
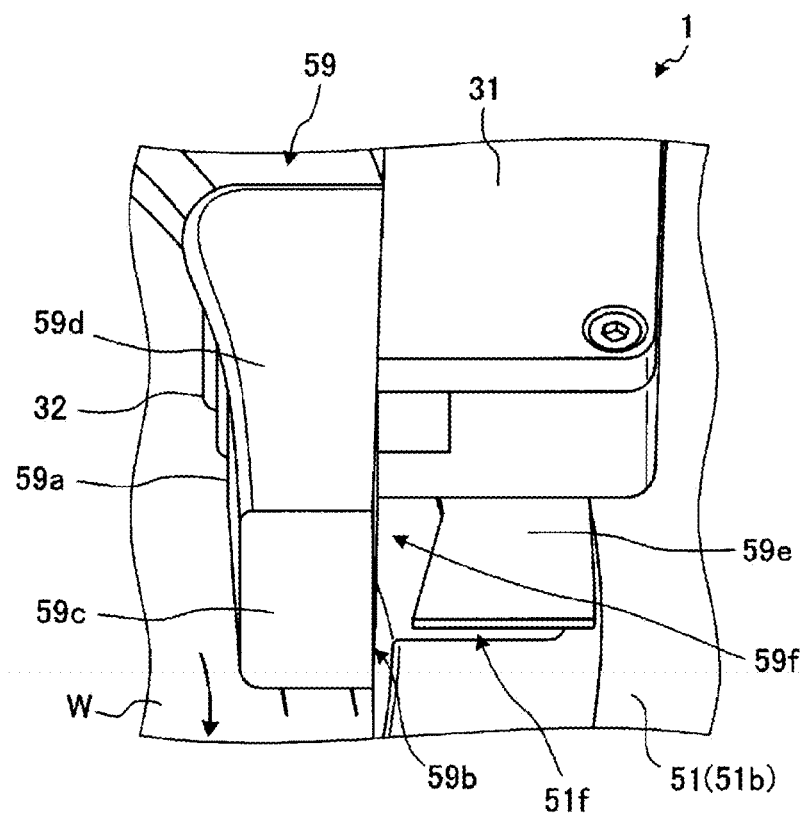
FIG. 20 is another perspective view illustrating the configuration of the cover according to Modification 8 of the embodiment.

FIGS. 19 and 20 are perspective views illustrating a structure of a cover 59 according to Modification 8 of the embodiment. FIG. 19 is a perspective view when viewing the nozzle 32 from inside, and FIG. 20 is a perspective view when viewing the nozzle 32 from the above. In addition, FIGS. 19 and 20 illustrate cases where the nozzle 32 is at the processing position above the periphery of the wafer W.

As illustrated in FIGS. 19 and 20, in Modification 8, the nozzle 32 has the cover 59. The cover 59 is disposed around the nozzle 32. The cover 59 has sidewalls 59*a*, 59*b*, and 59*c*, an upper wall 59*d*, and a protrusion 59*e*.

Each of the sidewalls 59*a*, 59*b*, and 59*c* is disposed close to a side portion of the nozzle 32 and extends in the vertical direction. The sidewall 59*a* is disposed inward of the nozzle 32 when viewed from the center of the substrate rotator 20. The sidewall 59*b* is disposed outward of the nozzle 32 when viewed from the center of the substrate rotator 20. The sidewall 59*c* is provided at a position interconnecting the sidewall 59*a* and the sidewall 59*b*.

The upper wall 59*d* is disposed above while being close to the nozzle 32, and extends in the horizontal direction. The upper wall 59*d* is disposed above the nozzle 32 at the position interconnecting the sidewall 59*a* and the sidewall 59*b*. The protrusion 59*e* is disposed outside the sidewall 59*b* and extends in the horizontal direction. That is, the protrusion 59*e* protrudes horizontally outward from an outer surface of the sidewall 59*b*.

In addition, in Modification 8, the upper annular portion 51*b* of the outer cup 51 has openings 51*e* and 51*f*. Via the opening 51*e*, the processing liquid supplied from the nozzle 32 and scattered from the wafer W flows toward the liquid reception space 60 (see FIG. 18).

This makes it possible to suppress the processing liquid supplied from the nozzle 32 and scattered from the wafer W from directly contacting the inner peripheral end of the outer cup 51. Therefore, according to Modification 8, it is possible to suppress the processing liquid from rebounding from the inner peripheral end of the outer cup 51.

For example, the opening 51*e* may be formed from the vicinity of the nozzle 32 in the inner peripheral end of the outer cup 51 to a position where the processing liquid supplied from the nozzle 32 and scattered from the wafer W does not contact the inner peripheral end of the outer cup 51. This makes it possible to suppress the processing liquid from rebounding from the inner peripheral end of the outer cup 51, thus suppressing the processing liquid from flowing backward from the inner surface 51*d* of the outer cup 51 (see FIG. 18).

Therefore, according to Modification 8, it is possible to further suppress the wafer W from being contaminated by the processing liquid scattered from the wafer W.

The opening 51*f* is formed to allow the nozzle 32 to move between the processing position and the standby position. That is, when the nozzle 32 is at the standby position, the nozzle 32 is accommodated in the opening 51*f*. On the other hand, when the nozzle 32 is at the processing position, the nozzle 32 is located inward of the opening 51*f*.

Here, in Modification 8, as illustrated in FIG. 19, when the nozzle 32 is at the processing position, at least a portion of the opening 51*f* may be closed by the sidewall 59*b*. Thus, when the nozzle 32 is at the processing position, an opening area of the opening 51*f* may be reduced, which reduces an area of a gap between the wafer W and the outer cup 51.

That is, in Modification 8, during the liquid process on the wafer W, a flow velocity of the swirling flow on the wafer W may be increased in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 8, it is possible to suppress the wafer W from being contaminated by the backwardly-flowing processing liquid.

In addition, in Modification 8, as illustrated in FIG. 20, when the nozzle 32 is at the processing position, at least a portion of the opening 51*f* may be closed by the protrusion 59*e*. Thus, when the nozzle 32 is at the processing position, an opening area of the opening 51*f* may be reduced. This makes it possible to reduce the area of the gap between the wafer W and the outer cup 51.

That is, in Modification 8, during the liquid process on the wafer W, the flow velocity of the swirling flow on the wafer W may be increased in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 8, it is possible to suppress the wafer W from being contaminated by the backwardly flowing processing liquid.

In addition, in Modification 8, as illustrated in FIG. 20, a slit 59*f* may be provided between the protrusion 59*e* and the sidewall 59*b*. Accordingly, a downward-flow which is oriented downward from the slit 59*f* may be formed in a space formed below the protrusion 59*e*.

Therefore, according to Modification 8, the space formed below the protrusion 59e may be suppressed from clogging by the mist of the processing liquid, which makes it possible to suppress the wafer W from being contaminated by the mist of the processing liquid remaining in the space.

<Modification 9>

Figure 21:
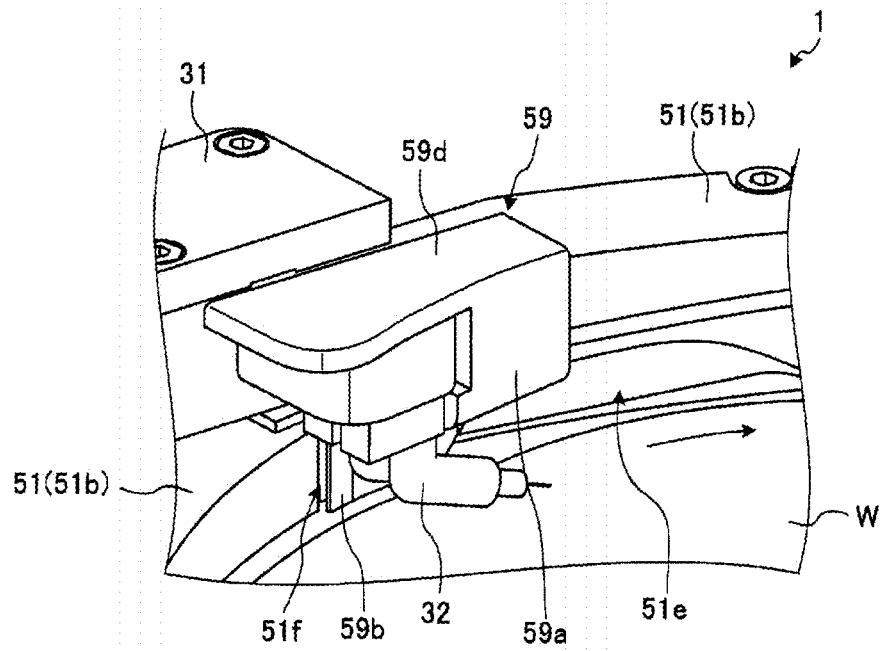
FIG. 21 is a perspective view illustrating a configuration of a cover according to Modification 9 of the embodiment.
Figure 22:
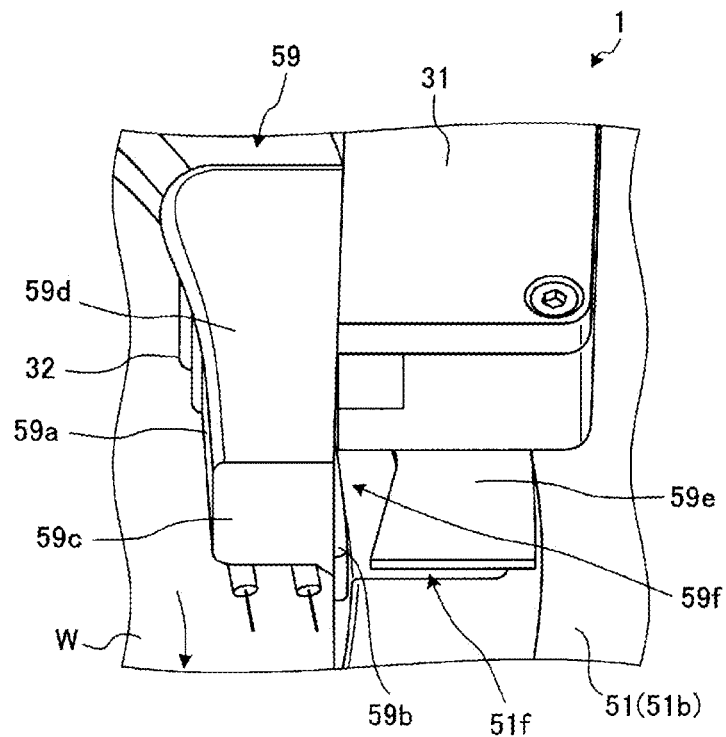
FIG. 22 is another perspective view illustrating the configuration of the cover according to Modification 9 of the embodiment.

FIGS. 21 and 22 are perspective views illustrating a configuration of a cover 59 according to Modification 9 of the embodiment. FIG. 21 is a perspective view when viewing the nozzle 32 from inside, and FIG. 22 is a perspective view when viewing the nozzle 32 from above. In addition, FIGS. 21 and 22 illustrate cases where the nozzle 32 is at the processing position above the periphery of the wafer W.

As illustrated in FIGS. 21 and 22, in Modification 9, the areas of sidewall 59a and sidewall 59c are smaller than those in Modification 8 described above. As in Modification 8 described above, when the nozzle 32 is at the processing position, at least a portion of the opening 51f may be closed by the sidewall 59b, which reduces the area of the gap between the wafer W and the outer cup 51.

That is, in Modification 9, during the liquid process on the wafer W, the flow velocity of the swirling flow on the wafer W may be increased in the gap between the wafer W and the outer cup 51. This makes it possible to suppress the mist of the processing liquid left on the inner surface 51d or remaining in the liquid reception space 60 from flowing backward toward the wafer W. Therefore, according to Modification 9, it is possible to suppress the wafer W from being contaminated by the backwardly-flowing processing liquid.

In addition, in Modification 9, as in Modification 8 described above, when the nozzle 32 is at the processing position, at least a portion of the opening 51f may be closed by the protrusion 59e. Thus, when the nozzle 32 is at the processing position, the opening area of the opening 51f may be reduced, which makes it possible to reduce the gap area between the wafer W and the outer cup 51.

That is, in Modification 9, during the liquid process on the wafer W, the flow velocity of the swirling flow on the wafer W may be increased in the gap between the wafer W and the outer cup 51. This makes it possible to suppress the mist of the processing liquid left on the inner surface 51d or remaining in the liquid reception space 60 from flowing backward toward the wafer W. Therefore, according to Modification 9, it is possible to suppress the wafer W from being contaminated by the backwardly-flowing processing liquid.

In addition, in Modification 9, as in Modification 8 described above, the slit 59f may be provided between the protrusion 59e and the sidewall 59b. Accordingly, the downward-flow which is oriented downward from the slit 59f may be formed in a space formed below the protrusion 59e.

Therefore, according to Modification 9, the space formed below the protrusion 59e may be suppressed from clogging by the mist of the processing liquid, which makes it possible to suppress the wafer W from being contaminated by the mist of the processing liquid remaining in the space.

<Modification 10>

Figure 23:
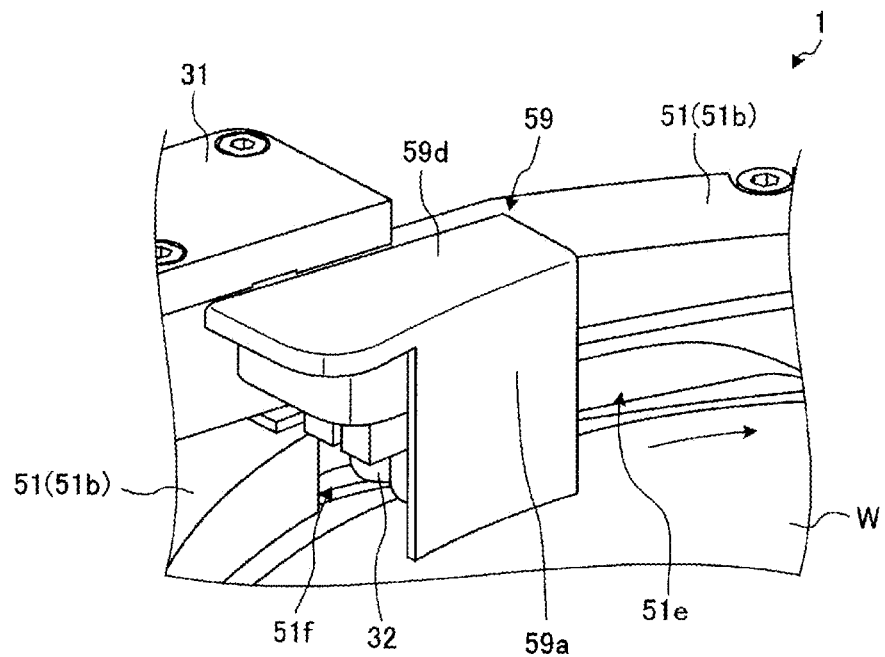
FIG. 23 is a perspective view illustrating a configuration of a cover according to Modification 10 of the embodiment.
Figure 24:
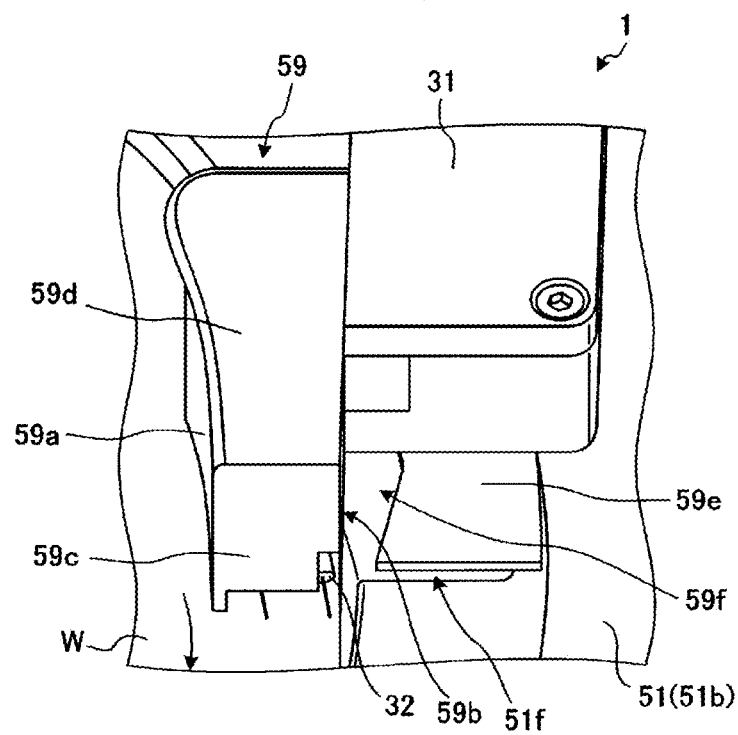
FIG. 24 is another perspective view illustrating the configuration of the cover according to Modification 10 of the embodiment.

FIGS. 23 and 24 are perspective views illustrating a configuration of a cover 59 according to Modification 10 of the embodiment. FIG. 23 is a perspective view when viewing the nozzle 32 from inside, and FIG. 24 is a perspective view when viewing the nozzle 32 from above. In addition, FIGS. 23 and 24 illustrate cases where the nozzle 32 is at the processing position above the periphery of the wafer W.

As illustrated in FIGS. 23 and 24, Modification 10 differs in the configurations of the sidewalls 59a and 59b from Modification 8 described above. Specifically, in Modification 10, when the nozzle 32 is not in the processing position but in the standby position, at least a portion of the opening 51f is closed by the sidewall 59a.

When the nozzle 32 is at the standby position, the opening area of the opening 51f may be reduced, and thus the area of the gap between the wafer W and the outer cup 51 may be reduced.

That is, in Modification 10, when the nozzle 32 is on standby, the flow velocity of the swirling flow on the wafer W may be increased in the gap between the wafer W and the outer cup 51. This makes it possible to suppress the mist of the processing liquid left on the inner surface 51d or remaining in the liquid reception space 60 from flowing backward toward the wafer W. Therefore, according to Modification 10, it is possible to suppress the wafer W from being contaminated by the backwardly-flowing processing liquid.

In addition, in Modification 10, as in Modification 8 described above, when the nozzle 32 is at the processing position, at least a portion of the opening 51f may be closed by the protrusion 59e. Thus, when the nozzle 32 is at the processing position, the opening area of the opening 51f may be reduced, and thus the area of the gap between the wafer W and the outer cup 51 can be reduced.

That is, in Modification 10, during the liquid process on the wafer W, the flow velocity of the swirling flow on the wafer W may be increased in the gap between the wafer W and the outer cup 51. This makes it possible to suppress the mist of the processing liquid left on the inner surface 51d or remaining in the liquid reception space 60 from flowing backward toward the wafer W. Therefore, according to Modification 10, it is possible to suppress the wafer W from being contaminated by the backwardly-flowing processing liquid.

In addition, in Modification 10, as in Modification 8 described above, the slit 59f may be provided between the protrusion 59e and the sidewall 59b. Thus, the downward-flow which is oriented downward from the slit 59f may be formed in a space formed below the protrusion 59e.

Therefore, according to Modification 10, the space formed below the protrusion 59e may be suppressed from clogging by the mist of the processing liquid, which makes it possible to suppress the wafer W from being contaminated by the mist of the processing liquid remaining in the space.

<Modification 11>

Figure 25:
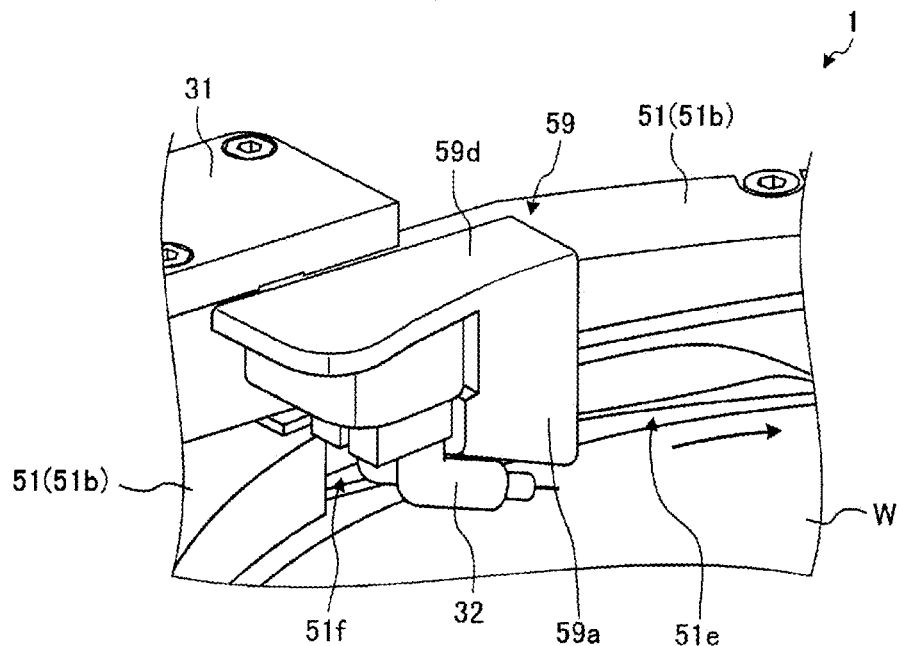
FIG. 25 is a perspective view illustrating a configuration of a cover according to Modification 11 of the embodiment.
Figure 26:
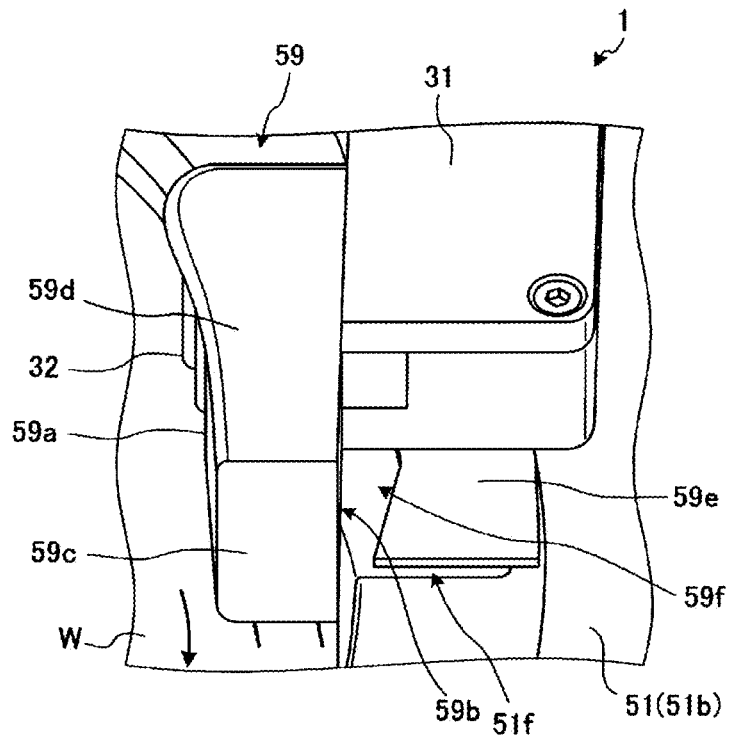
FIG. 26 is another perspective view illustrating the configuration of the cover according to Modification 11 of the embodiment.

FIGS. 25 and 26 are perspective views illustrating a configuration of the cover 59 according to Modification 11 of the embodiment. FIG. 25 is a perspective view when viewing the nozzle 32 from inside, and FIG. 26 is a perspective view when viewing the nozzle 32 from above. In addition, FIGS. 25 and 26 illustrate cases where the nozzle 32 is at the processing position above the periphery of the wafer W.

As illustrated in FIGS. 25 and 26, Modification 11 differs in the configurations of the sidewalls 59a and 59b from Modifications 8 and 10 described above. Specifically, in Modification 11, since the areas of the sidewall 59a and the sidewall 59b are small, the entire opening 51f may not be closed by the sidewalls 59a and 59b.

Because of this, when the nozzle 32 is at the processing position or the standby position, the opening area of the opening 51f may be reduced to some extent. This makes it possible to reduce the area of the gap between the wafer W and the outer cup 51.

That is, in Modification 11, the flow velocity of the swirling flow on the wafer W may be increased to some extent in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 11, it is possible to suppress the wafer W from being contaminated by the backwardly-flowing processing liquid.

In addition, in Modification 11, as in Modification 8 described above, when the nozzle 32 is at the processing position, at least a portion of the opening 51*f* may be closed by the protrusion 59*e*. Thus, when the nozzle 32 is at the processing position, the opening area of the opening 51*f* may be reduced, which reduces the area of the gap between the wafer W and the outer cup 51.

That is, in Modification 11, during the liquid process on the wafer W, the flow velocity of the swirling flow on the wafer W may be increased in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 11, it is possible to suppress the wafer W from being contaminated by the backwardly-flowing processing liquid.

In addition, in Modification 11, as in Modification 8 described above, the slit 59*f* may be provided between the protrusion 59*e* and the sidewall 59*b*. Thus, the downward-flow which is oriented downward from the slit 59*f* may be formed in the space formed below the protrusion 59*e*.

Therefore, according to Modification 11, the space formed below the protrusion 59*e* may be suppressed from clogging by the mist of the processing liquid, which makes it possible to suppress the wafer W from being contaminated by the mist of the processing liquid remaining in the space.

<Modification 12>

Figure 27:
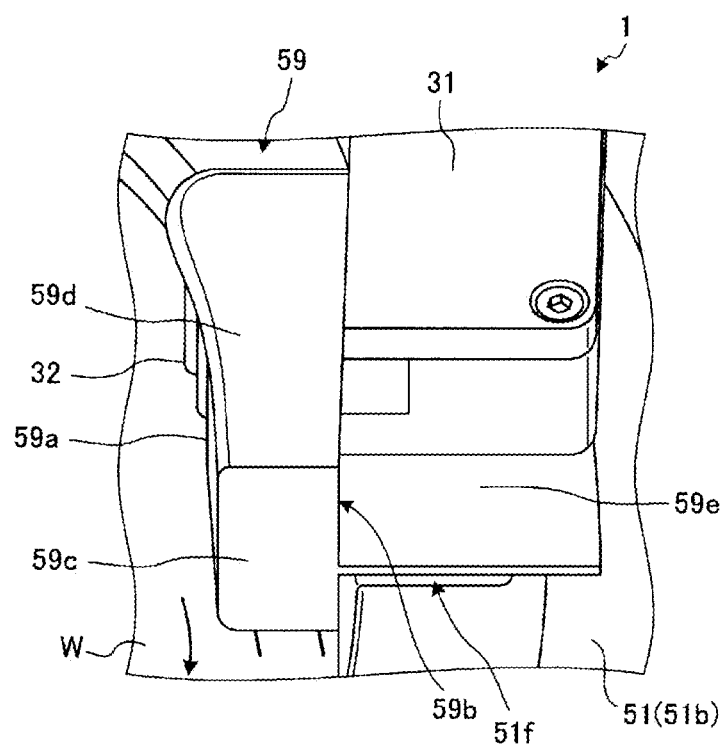
FIG. 27 is a perspective view illustrating a configuration of a cover according to Modification 12 of the embodiment.

FIG. 27 is a perspective view illustrating a configuration of a cover 59 according to Modification 12 of the embodiment. In addition, FIG. 27 is a perspective view when viewing the nozzle 32 from above, and illustrates a case where the nozzle 32 is at the processing position above the periphery of the wafer W.

As illustrated in FIG. 27, Modification 12 differs from Modification 11 described above in that the cover 59 is not provided with the slit 59*f*. Even in Modification 12, by providing the sidewalls 59*a* and 59*b* in the cover 59, it is possible to reduce the area of the gap between the wafer W and the outer cup 51.

That is, in Modification 12, the flow velocity of the swirling flow on the wafer W may be increased to some extent in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 12, it is possible to suppress the wafer W from being contaminated by the backwardly-flowing processing liquid.

In addition, in Modification 12, as in Modification 11 described above, when the nozzle 32 is at the processing position, at least a portion of the opening 51*f* may be closed by the protrusion 59*e*. Thus, when the nozzle 32 is at the processing position, the opening area of the opening 51*f* may be reduced, and thus the area of the gap between the wafer W and the outer cup 51 can be reduced.

That is, in Modification 12, during the liquid process on the wafer W, the flow velocity of the swirling flow on the wafer W may be increased in the gap between the wafer W and the outer cup 51. This makes it possible to suppress the mist of the processing liquid left on the inner surface 51*d* or remaining in the liquid reception space 60 from flowing backward toward the wafer W. Therefore, according to Modification 12, it is possible to suppress the wafer W from being contaminated by the backwardly-flowing processing liquid.

The substrate processing apparatus 1 according to the embodiment includes the substrate rotator 20, the outer cup 51, the inner cup 52, the annular drain 64, and the exhaust passage 62. The substrate rotator 20 holds and rotates the substrate (the wafer W). The outer cup 51 annularly covers the periphery of the substrate (the wafer W) held by the substrate rotator 20. The inner cup 52 is disposed inside the outer cup 51 and under the substrate (the wafer W) held by the substrate rotator 20. The annular drain 64 is formed between the outer cup 51 and the inner cup 52 to discharge the processing liquid supplied to the substrate (the wafer W) to the outside. The exhaust passage 62 is formed inside the inner cup 52. The inner cup 52 includes the exhaust hole 61 through which the liquid reception space 60, which is formed by the inner cup 52 and the outer cup 51, and the exhaust passage 62 are in communication with each other. The exhaust hole 61 is formed obliquely downward from the outer surface 52*c* to the inner surface 52*d* of the inner cup 52. As a result, the wafer W may be suppressed from being contaminated by the mist of the processing liquid remaining around the wafer W.

Further, in the substrate processing apparatus 1 according to the embodiment, the inner cup 52 has the inclined portion 52*a* that gradually descends outward, and the vertical portion 52*b* that extends vertically from the outer peripheral end of the inclined portion 52*a* toward the annular drain 64. In addition, the exhaust hole 61 is disposed in the vertical portion 52*b*. This makes it possible to effectively separate the processing liquid flowing downward along the inner cup 52.

In addition, in the substrate processing apparatus 1 according to the embodiment, the outer cup 51 includes the upper annular member 54, the inner surface of which is inclined along the inclined portion 52*a* of the inner cup 52. In addition, the inner surface of the upper annular member 54 has the hydrophobic surface (the front surface 55*c*) having a given width at the inner peripheral end thereof, and the hydrophilic surface (the inner surface 55*a*) located outward of the hydrophobic surface (the front surface 55*c*) in a plan view. As a result, the wafer W may be suppressed from being contaminated by the processing liquid that flows backward from the inner surface of the upper annular member 54.

In addition, the substrate processing apparatus 1 according to the embodiment further includes the processing liquid nozzle (the nozzle 32) that is movable in the horizontal direction and supplies the processing liquid to the substrate (the wafer W) held by the substrate rotator 20. In addition, the outer cup 51 has the opening 51*f* through which the processing liquid nozzle (the nozzle 32) moves between the processing position above the periphery of the substrate (the wafer W) and the standby position outside the processing position. In addition, the processing liquid nozzle (nozzle 32) includes the cover 59 which closes at least a portion of the opening 51*f*. As a result, it is possible to suppress the wafer W from being contaminated by the backwardly-flowing processing liquid.

In addition, in the substrate processing apparatus 1 according to the embodiment, the cover 59 includes the sidewalls 59*a*, 59*b*, and 59*c* and the upper wall 59*d*. The sidewalls 59*a*, 59*b*, and 59*c* are disposed close to the lateral portion of the processing liquid nozzle (the nozzle 32). The upper wall 59d is disposed above the processing liquid nozzle (the nozzle 32). As a result, it is possible to suppress the wafer W from being contaminated by the backwardly-flowing processing liquid.

In addition, in the substrate processing apparatus 1 according to the embodiment, the sidewall 59b is disposed outward of the processing liquid nozzle (the nozzle 32) when viewed from the center of the substrate rotator 20. When the processing liquid nozzle (the nozzle 32) is at the processing position, the sidewall 59b closes at least a portion of the opening 51f. As a result, it is possible to suppress the wafer W from being contaminated by the backwardly-flowing processing liquid.

In addition, in the substrate processing apparatus 1 according to the embodiment, the sidewall 59a is disposed inward of the processing liquid nozzle (the nozzle 32) when viewed from the center of the substrate rotator 20. When the processing liquid nozzle (the nozzle 32) is at the standby position, the sidewall 59a closes at least a portion of the opening 51f. As a result, it is possible to suppress the wafer W from being contaminated by the backwardly-flowing processing liquid.

In addition, in the substrate processing apparatus 1 according to the embodiment, the inner surface 51d of the outer cup 51 has the horizontal portion 51d1 that extends horizontally outward from the location closest to the substrate (the wafer W). As a result, it is possible to suppress the wafer W from being contaminated by the backwardly-flowing processing liquid.

In addition, the substrate processing apparatus 1 according to the embodiment further includes the cleaning liquid nozzle 46 configured to supply the cleaning liquid CL to the annular drain 64. In addition, the annular drain 64 has the drain port 64a formed on the lower surface at the position opposite to the position where the cleaning liquid nozzle 46 is provided. As a result, the entire annular drain 64 may be cleaned effectively.

In addition, in the substrate processing apparatus 1 according to the embodiment, the annular drain 64 is inclined such that the drain port 64a is the lowest. As a result, the entire annular drain 64 may be cleaned effectively.

In addition, the substrate processing apparatus 1 according to an embodiment further includes the controller 12 configured to control each constituent element of the substrate processing apparatus 1. In addition, after processing the previous substrate (the wafer W) with the processing liquid and before processing the next substrate (the wafer W) with the processing liquid, the controller 12 supplies the cleaning liquid CL from the cleaning liquid nozzle 46 to the annular drain 64. As a result, even if the amount of the mist of the processing liquid remaining in the liquid reception space 60 during the drain cleaning process temporarily increases, it is possible to suppress the wafer W from being contaminated.

In addition, the substrate processing apparatus 1 according to an embodiment further includes the controller 12 configured to control each constituent element of the substrate processing apparatus 1. In addition, the controller 12 is configured to supply the cleaning liquid CL from the cleaning liquid nozzle 46 to the annular drain 64 at a timing when an operation of supplying a rinsing liquid from a nozzle to the substrate (the wafer W) is performed. This shortens the total processing time required to process the wafer W.

In addition, the substrate processing method according to the embodiment includes the operation (step S111) of supplying the cleaning liquid CL to the annular drain 64 in the above-described substrate processing apparatus 1. In the operation (step S111) of supplying the cleaning liquid CL, after processing the previous substrate (the wafer W) with the processing liquid and before processing the next substrate (the wafer W) with the processing liquid, the cleaning liquid CL is supplied from the cleaning liquid nozzle 46 to the annular drain 64. As a result, even if the amount of the mist of the processing liquid remaining in the liquid reception space 60 during the drain cleaning process temporarily increases, the wafer W may be suppressed from being contaminated.

In addition, the substrate processing method according to the embodiment includes the operation (step S121) of supplying the cleaning liquid CL to the annular drain 64 in the above-described substrate processing apparatus 1. In the operation (step S121) of supplying the cleaning liquid CL, the cleaning liquid CL is supplied from the cleaning liquid nozzle 46 to the annular drain 64 at a timing when the operation (step S103) of supplying the rinsing liquid from the nozzle 32 to the substrate (the wafer W) is performed. This shortens the total processing time required to process the wafer W.

Although each embodiment of the present disclosure has been described above, the present disclosure is not necessarily limited thereto, and various changes may be made without departing from the scope of the present disclosure.

It should be noted that the embodiments disclosed herein are exemplary in all respects and are not restrictive. Indeed, each embodiment described above may be embodied in various forms. The above-described embodiments may be omitted, replaced or modified in various forms without departing from the scope and spirit of the appended claims.

EXPLANATION OF REFERENCE NUMERALS

W: Wafer (example of substrate)
1: Substrate processing apparatus
12: Controller
20: Substrate rotator
32: Nozzle
46: Cleaning liquid nozzle
50: Recoverer
51: Outer cup
51d: Inner surface
51d1: Horizontal portion
51f: Opening
52: Inner cup
52a: Inclined portion
52b: Vertical portion
52c: Outer surface
52d: Inner surface
53: Cup base
53a: Inner surface
54: Upper annular member
55: First member
55a: Inner surface (example of hydrophilic surface)
56: Second member
56a: Surface (example of hydrophobic surface)
56b: Support portion
56c: Bent portion
59: Cover
59a, 59b, 59c: Sidewall
59d: Upper wall
59e: Protrusion
60: Liquid reception space
61: Exhaust hole 62: Exhaust passage
63: Exhaust port
64: Annular drain
64a: Drain port
64b: Cleaning liquid supply portion
CL: Cleaning liquid

What is claimed is:

1. A substrate processing apparatus comprising:
a substrate rotator configured to hold and rotate a substrate;
an outer cup configured to annularly cover a periphery of the substrate held by the substrate rotator;
an inner cup disposed inside the outer cup and under the substrate held by the substrate rotator;
an annular drain formed between the outer cup and the inner cup to discharge a processing liquid supplied to the substrate outward; and
an exhaust passage formed inside the inner cup,
wherein the inner cup has an exhaust hole through which a liquid reception space, which is formed by the inner cup and the outer cup, and the exhaust passage are in communication with each other, and
wherein the exhaust hole is formed obliquely downward from an outer surface to an inner surface of the inner cup.

2. The substrate processing apparatus of claim 1, wherein the inner cup includes an inclined portion which gradually descends outward, and a vertical portion which extends in a vertical direction from an outer peripheral end of the inclined portion toward the annular drain, and
wherein the exhaust hole is arranged in the vertical portion.

3. The substrate processing apparatus of claim 2, wherein the outer cup includes an upper annular member, and an inner surface of the upper annular member is inclined along the inclined portion of the inner cup, and
wherein the inner surface of the upper annular member includes, in a plan view, a hydrophobic surface having a predetermined width at an inner peripheral end of the upper annular member, and a hydrophilic surface located outside the hydrophobic surface.

4. The substrate processing apparatus of claim 3, further comprising:
a processing liquid nozzle configured to be movable in a horizontal direction and supply the processing liquid to the substrate held by the substrate rotator,
wherein the outer cup has an opening formed to allow the processing liquid nozzle to move between a processing position above a periphery of the substrate and a standby position outside the processing position, and
wherein the processing liquid nozzle includes a cover configured to close at least a portion of the opening.

5. The substrate processing apparatus of claim 4, wherein the cover includes a sidewall and an upper wall,
wherein the sidewall is disposed close to a side portion of the processing liquid nozzle, and
wherein the upper wall is disposed above the processing liquid nozzle.

6. The substrate processing apparatus of claim 5, wherein the sidewall is disposed outward of the processing liquid nozzle when viewed from a center of the substrate rotator, and is configured to close the at least a portion of the opening when the processing liquid nozzle is at the processing position.

7. The substrate processing apparatus of claim 5, wherein the sidewall is disposed inward of the processing liquid nozzle when viewed from a center of the substrate rotator, and is configured to close the at least a portion of the opening when the processing liquid nozzle is at the standby position.

8. The substrate processing apparatus of claim 1, wherein an inner surface of the outer cup has a horizontal portion extending horizontally outward from a point closest to the substrate.

9. The substrate processing apparatus of claim 1, further comprising:
a cleaning liquid nozzle configured to supply a cleaning liquid to the annular drain,
wherein the annular drain has a drain port formed on a lower surface of the annular drain at a position opposite to a position where the cleaning liquid nozzle is provided.

10. The substrate processing apparatus of claim 9, wherein the annular drain is inclined such that the drain port is at a lowest point.

11. The substrate processing apparatus of claim 9, further comprising:
a controller configured to control each part,
wherein the controller controls the cleaning liquid nozzle to supply the cleaning liquid to the annular drain after processing a previous substrate with the processing liquid and before processing a next substrate with the processing liquid.

12. The substrate processing apparatus of claim 9, further comprising:
a controller configured to control each part,
wherein the controller controls the cleaning liquid nozzle to supply the cleaning liquid to the annular drain at a timing when an operation of supplying a rinsing liquid from a nozzle to the substrate is performed.

13. The substrate processing apparatus of claim 1, further comprising:
a processing liquid nozzle configured to be movable in a horizontal direction and supply the processing liquid to the substrate held by the substrate rotator,
wherein the outer cup has an opening formed to allow the processing liquid nozzle to move between a processing position above a periphery of the substrate and a standby position outside the processing position, and
wherein the processing liquid nozzle includes a cover configured to close at least a portion of the opening.

14. A substrate processing method performed in a substrate processing apparatus,
wherein the substrate processing apparatus includes: a substrate rotator configured to hold and rotate a substrate; an outer cup configured to annularly cover a periphery of the substrate held by the substrate rotator; an inner cup disposed inside the outer cup and under the substrate held by the substrate rotator; an annular drain formed between the outer cup and the inner cup to discharge a processing liquid supplied to the substrate outward; an exhaust passage formed inside the inner cup; and a cleaning liquid nozzle configured to supply a cleaning liquid to the annular drain, and
wherein the inner cup has an exhaust hole through which a liquid reception space, which is formed by the inner cup and the outer cup, and the exhaust passage are in communication with each other, and the exhaust hole is formed obliquely downward from an outer surface to an inner surface of the inner cup,
the substrate processing method comprising:
supplying, by the cleaning liquid nozzle, the cleaning liquid to the annular drain after processing a previous substrate with the processing liquid and before processing a next substrate with the processing liquid.

15. A substrate processing method performed in a substrate processing apparatus,
 wherein the substrate processing apparatus includes: a substrate rotator configured to hold and rotate a substrate; an outer cup configured to annularly cover a periphery of the substrate held by the substrate rotator; an inner cup disposed inside the outer cup and under the substrate held by the substrate rotator; an annular drain formed between the outer cup and the inner cup to discharge a processing liquid supplied to the substrate outward, an exhaust passage formed inside the inner cup; and a cleaning liquid nozzle configured to supply a cleaning liquid to the annular drain, and
 wherein the inner cup has an exhaust hole through which a liquid reception space, which is formed by the inner cup and the outer cup, and the exhaust passage are in communication with each other, and the exhaust hole is formed obliquely downward from an outer surface to an inner surface of the inner cup,
the substrate processing method comprising:
supplying, by the cleaning liquid nozzle, the cleaning liquid to the annular drain at a timing when an operation of supplying a rinsing liquid from a nozzle to the substrate is performed.

\* \* \* \* \*